(12) United States Patent
Takashima

(10) Patent No.: US 6,643,163 B2
(45) Date of Patent: Nov. 4, 2003

(54) SEMICONDUCTOR DEVICE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/376,237

(22) Filed: Mar. 3, 2003

(65) Prior Publication Data

US 2003/0142534 A1 Jul. 31, 2003

Related U.S. Application Data

(62) Division of application No. 10/024,250, filed on Dec. 21, 2001, now Pat. No. 6,549,449.

(30) Foreign Application Priority Data

Dec. 25, 2000 (JP) .......................................... 2000-392288

(51) Int. Cl.$^7$ .......................... G11C 11/22; G11C 11/24
(52) U.S. Cl. .................... 365/145; 365/149; 365/230.06
(58) Field of Search ................. 365/145, 149, 365/230.06

(56) References Cited

U.S. PATENT DOCUMENTS

| | | | |
|---|---|---|---|
| 5,287,325 A | 2/1994 | Morita | |
| 5,432,731 A | * 7/1995 | Kirsch et al. | ................ 365/145 |
| 5,903,492 A | 5/1999 | Takashima | |
| 6,031,768 A | 2/2000 | Taylor | |
| 6,166,945 A | 12/2000 | Choi et al. | |
| 6,288,950 B1 | * 9/2001 | Koike | .................... 365/189.09 |

* cited by examiner

Primary Examiner—Son Mai
(74) Attorney, Agent, or Firm—Banner & Witcoff, Ltd.

(57) ABSTRACT

In a semiconductor memory device comprising a cell array of memory cells each including a cell transistor and a capacitor, word lines and bit line pairs, the control circuit controls the memory circuit to set the bit lines to a high level to write "1" data into the memory cells regardless of a logic level of data to be written, in a state where a potential of a gate of the cell transistor of each memory cell is raised from a first potential of a standby time to a second potential of an active time, and thereafter to set the bit lines to a low level to write "0" data into the memory cells with "0" data to be written, in a state where the potential of the gate of the cell transistor is changed to a third potential higher than the first potential and lower than the second potential.

2 Claims, 20 Drawing Sheets

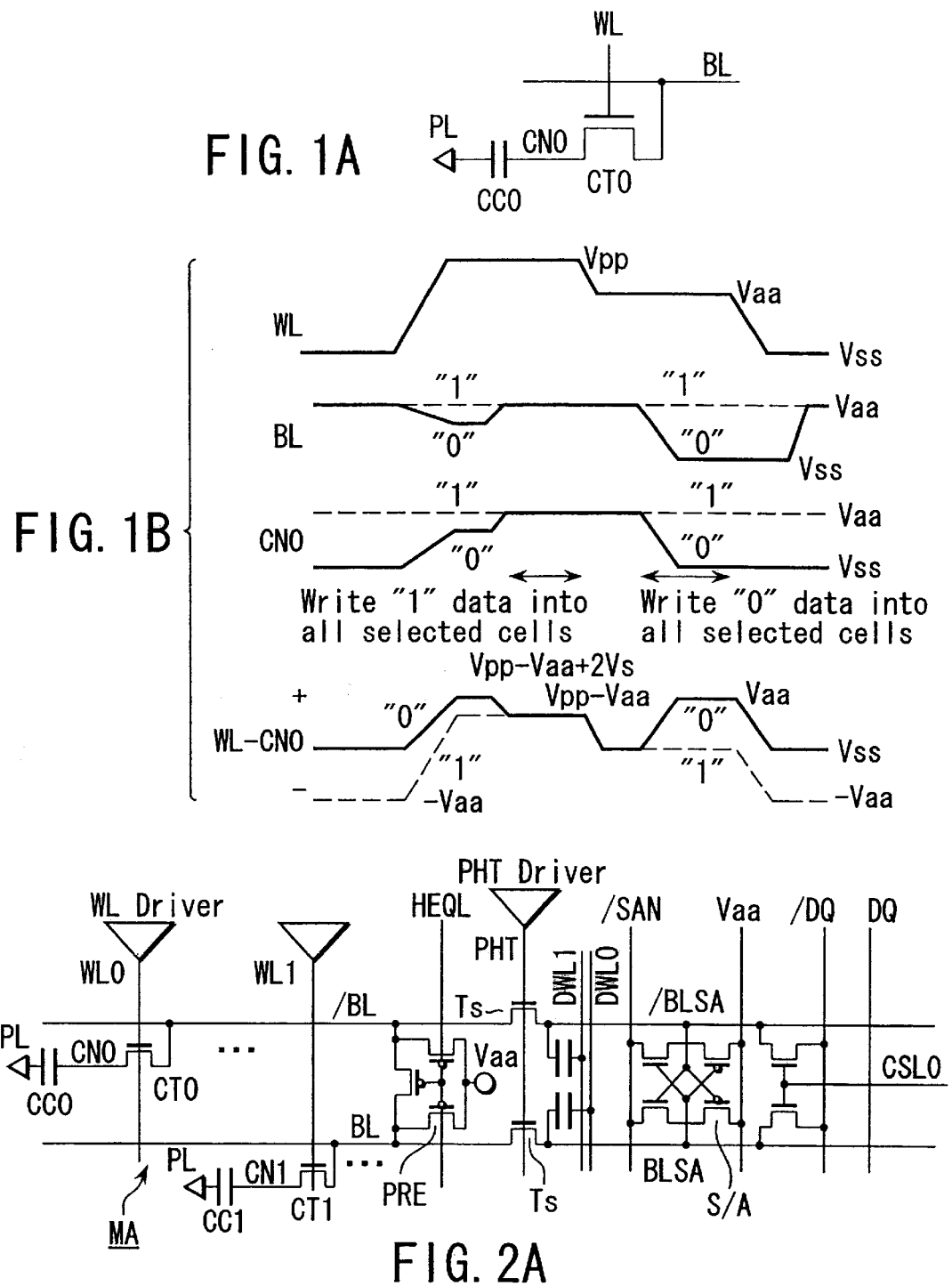

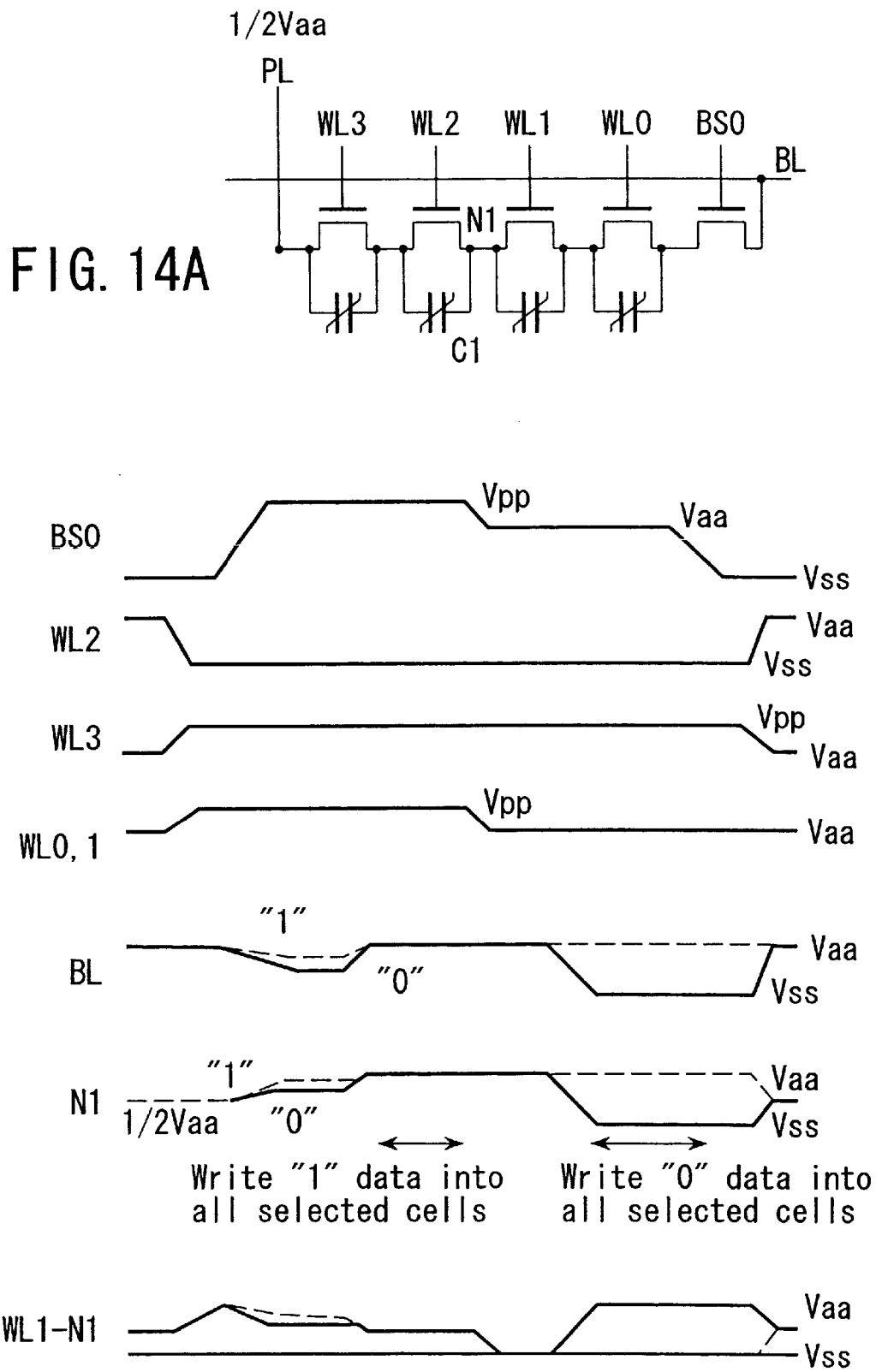

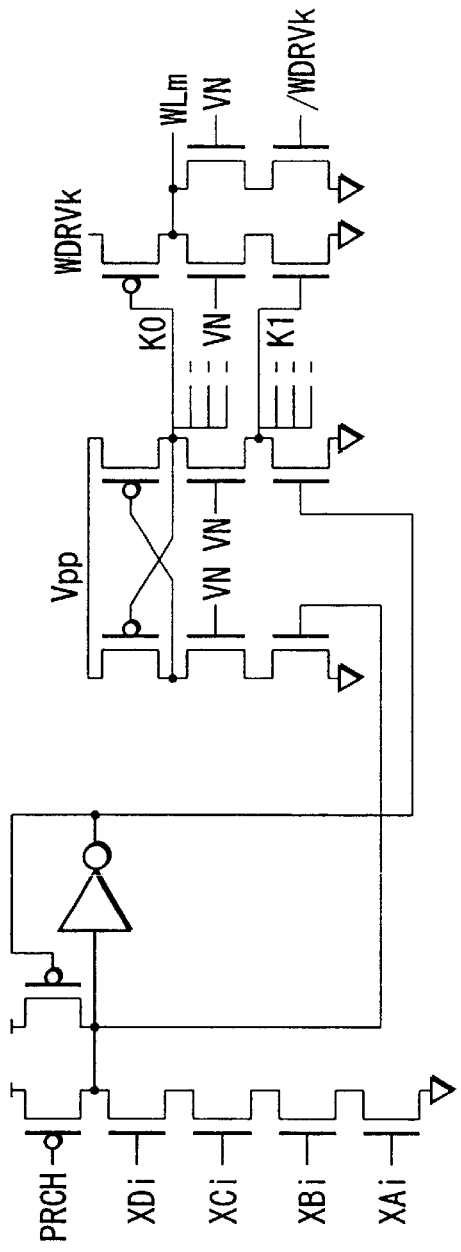
F I G. 26A
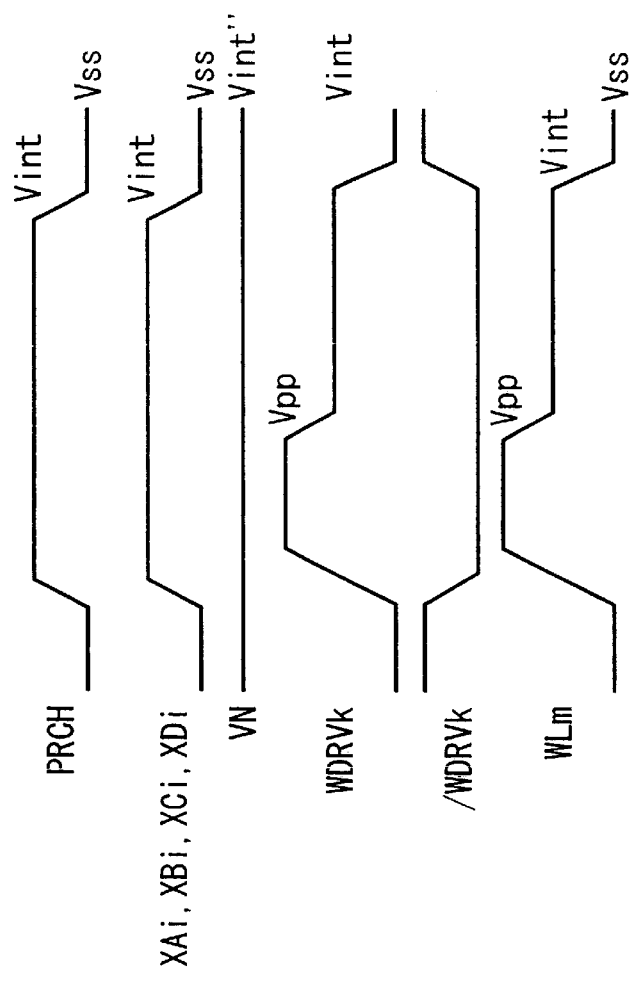
F I G. 26B

SEMICONDUCTOR DEVICE

CROSS-REFERENCE TO RELATED APPLICATIONS

This application is a divisional of U.S. application Ser. No. 10/024,250, filed Dec. 21, 2001, now U.S. Pat. No. 6,549,449 which is based upon and claims the benefit of priority from the prior Japanese Patent Application No. 2000-392288, filed Dec. 25, 2000, the entire contents of which are incorporated herein by reference.

BACKGROUND OF THE INVENTION

1. Field of the Invention

The present invention relates to semiconductor storage devices such as a dynamic memory (DRAM) and a nonvolatile ferroelectric memory.

2. Description of the Related Art

These days, a semiconductor memory is broadly been utilized as a storage device in electronic apparatuses such as, large-sized computers, personal computers, household electric products, and mobile phones. Examples of the semiconductor memory appearing on the market include a volatile dynamic RAM (DRAM), static RAM (SRAM), nonvolatile mask ROM (MROM), FlashE$^2$PROM, and the like. Although particularly the DRAM is a volatile memory, it is superior in terms of low cost and high speed, and occupies a major part of the market at present. On the other hand, a nonvolatile ferroelectric memory using a ferroelectric capacitor has been developed by respective makers, as it has a nonvolatile property, is many rewritable up to $10^{12}$ times, and has a read/write time as short as that of a DRAM, and the like.

FIG. 28A shows a circuit diagram of a conventional DRAM, and FIG. 28B shows a signal chart of an operation of the DRAM. As shown in FIG. 28A, one cell transistor CT0 is connected in series with one paraelectric capacitor CC0, one end (capacitor CC0 side) is connected to a plate line (PL), and the other end (cell transistor CT0 side) is connected to a bit line BL. Assuming that an amplitude voltage of the bit line is Vaa, the plate line is usually fixed at ½Vaa.

As a problem of the conventional DRAMs, the voltage of a word line WL for selecting a cell needs to be set to a boosted high voltage Vpp, the voltage applied to a memory cell transistor increases as a result, and size reduction of the memory cell transistor (size reduction of a gate oxide film thickness Tox, channel length L, or the like) cannot be realized.

As shown in FIG. 28B, during the operation, the voltage of the word line WL is raised to the voltage Vpp, and data is read into the bit line BL from a cell node CN0 of the DRAM cell. Thereafter, a sense amplifier is operated. When the data is "1" data, the voltage of the bit line BL is amplified to Vaa. When the data is "0" data, the voltage of the bit line BL is amplified to Vss. The result is rewritten into the cell node CN0. Therefore, when the "1" data, that is, Vaa is rewritten into the cell node CN0, a threshold voltage of the cell transistor is set to Vtcell, then Vpp>Vaa+Vtcell, and a high voltage, that is, the boosted voltage Vpp is required. In order to lower the voltage Vpp, the voltage Vaa and/or Vtcell may be reduced. However, when the voltage Vaa is lowered, a charge accumulated in the cell decreases, and deterioration of a data holding property and deterioration of a low voltage operation are caused. On the other hand, when Vtcell is lowered, the accumulated charge of the cell leaks to the bit line via the cell transistor, and the data holding property is deteriorated. Therefore, it is difficult to lower the voltage Vpp. For a conventional DRAM, the "0" data as well as the "1" data are rewritten. With the "0" data, the bit line voltage is Vss. The boosted voltage Vpp at maximum is applied between gate and source of the cell transistor, that is, between word line and cell node, as shown by the waveform WL–CN0 on the signal chart.

As described above, in a conventional DRAM, in order to maintain the holding property of the data to be satisfactory, Vtcell cannot be lowered, the high voltage, that is, the boosted voltage Vpp needs to be applied to the cell transistor as a result, and this inhibits a size reduction of the cell transistor. Therefore, a problem occurs that the memory cell size cannot be reduced, and a chip size cannot be reduced. When the size of the cell transistor is forced to be reduced, insulating film collapse, deterioration of an operation property due to a Hot Carrier, and Ioff increase by a short channel effect are generated. Therefore, with a design rule of the same development generation, as compared with a logic LSI, the gate oxide film thickness Tox and channel length L of the cell transistor of the DRAM are large by 30 to 50 percentages in actual circumstances. In addition to the problem that the chip size cannot be small, the problem of slow operation speed occurs in a DRAM-Logic mixed chip in which a logic section is constituted of a transistor having the same size as a cell transistor of the DRAM. To solve the problem, in a conventional technique, for a high-performance DRAM-Logic mixed chip, a transistor having a large Tox and L is used in the DRAM cell transistor, core section requiring the boosted voltage, and I/O section. On the other hand, a transistor having a small Tox and L is used in a DRAM peripheral circuit and the logic section. However, in this case, since two types of transistors are formed, the problem of process cost increase arises.

On the other hand, a method of driving a potential of the plate line PL and lowering Vpp with respect to the conventional DRAM is disclosed in the following:

1) K. Fujishima et al. "A storage-node-boosted RAM with word line delay compensation" International Solid-State Circuits Conference Digest Technical Paper, pp. 66–67, 1982;

2) M Aoki et al. "A 1.5 DRAM for battery-based application" IEEE Journal of Solid-State Circuits, vol. 24, No. 5, pp. 1206–1212, October 1989; and 3) T. Yamauchi et al. "High-performance embedded SOI DRAM architecture for a low-power supply" IEEE Journal of Solid-State Circuit, vol. 35, No. 8, pp. 1169–1178, August 2000.

A circuit constitution of the DRAM of this system and a signal chart of the operation are shown in FIGS. 29A, 29B. In the DRAM of this system, the plate line potential PL is amplified between Vss and Vaa, the bit line potential is amplified to Vaa (for "1" data) or Vss (for "0" data), thereafter the plate line potential PL is lowered to Vss, and "1" data of Vpp Vtcell is written into the cell node CN0. Subsequently, the word line potential is lowered to some degree, the "1" data is prevented from leaking, the plate line potential PL is lowered to Vaa, and the "0" data of Vss is written into the cell node CN0 in this system.

When the plate line potential PL is driven in this manner, as a result, a potential difference Vsig (1:0) of the "1" data and "0" data is Vsig(1:0)=Vpp−Vtcell+Vaa. The data is held to be satisfactory as compared with Vsig(1:0)=Vaa of the DRAM of a conventional plate line potential PL fixed system. According to this system, a doubled signal can be written similarly as use in the ferroelectric memory. However, on the condition of Vpp<Vaa+Vtcell, Vsig(1:0)= Vpp−Vtcell+Vaa<2Vaa. For example, as shown in FIG. 29B, on Vpp=Vaa, Vsig(1:0)=2Vaa−Vtcell. Consequently, similarly as in the DRAM of FIGS. 28A, 28B, the data is deteriorated because of a drop in the threshold value of the transistor. Moreover, in order to drive the plate line potential PL, the plate line needs to be separated for each memory cell, and the cell size increases. Another problem is that the driving of the plate line takes much time, which delays the operation.

This problem occurs not only in a DRAM but also in a ferroelectric memory. Examples of a conventional ferroelectric memory include a memory whose plate line potential PL is fixed (the paraelectric capacitor of FIG. 28A is replaced with a ferroelectric capacitor), and a memory whose plate line potential PL is driven (the paraelectric capacitor of FIG. 29A is replaced with a ferroelectric capacitor), and the problem is generated similarly as described above. Moreover, for a ferroelectric memory, the inventor of the present application has proposed a new nonvolatile ferroelectric memory in U.S. Pat. No. 5,903,492 characterized by three factors: (1) use of a small memory cell with a 4F2 size; (2) use of an easily manufacturable flat transistor; and (3) use of a general-purpose random access function. In the ferroelectric memory disclosed in the U.S. Pat. No. 5,903, 492, one memory cell is constituted by connecting the cell transistor in parallel to the ferroelectric capacitor, one memory cell block is constituted by connecting a plurality of memory cells in series, one end of the block is connected to the bit line via a block selection transistor, and the other end of the block is connected to the plate. Also in the ferroelectric memory disclosed in the U.S. Pat. No. 5,903,492, the systems in which the plate line potential PL is fixed, and the system whose plate line potential PL is driven, are present, resulting in the aforementioned problem.

As described above, in a conventional DRAM, conventional ferroelectric memory, or the ferroelectric memory disclosed in the U.S. Pat. No. 5,903,492, in order to suppress an OFF current of the cell transistor, and maintain a data holding time, the voltage applied to the memory cell transistor increases. As a result, there is a problem that it is difficult to reduce the cell transistor and the cell size cannot be reduced in order to secure reliability. Moreover, in a transistor constitution which has one gate oxide film thickness, the transistor of the peripheral circuit or the mixed logic section cannot be reduced, resulting in a deterioration in operation performance. Moreover, with use of a transistor which has two gate oxide film thicknesses, the performance of the peripheral circuit or the mixed logic section is raised, but process cost disadvantageously increases.

BRIEF SUMMARY OF THE INVENTION

According to a first aspect of the present invention, there is provided a semiconductor memory device comprising a semiconductor memory circuit which includes a memory cell array including a plurality of memory cells arranged in a matrix form each constituted of a cell transistor and a capacitor whose one end is connected to a plate line, a plurality of word lines, and a plurality of bit lines constituting a pair of bit lines connected to a sense amplifier; and a control circuit which controls the semiconductor memory circuit to set the bit lines to a high level to write "1" data into the memory cells regardless of a logic level of data to be written, in a state where a potential of a gate of the cell transistor of each memory cell is raised from a first potential of a standby time to a second potential of an active time, and thereafter to set the bit lines to a low level to write "0" data into the memory cells with "0" data to be written, in a state where the potential of the gate of the cell transistor is changed to a third potential higher than the first potential and lower than the second potential.

According to a second aspect of the present invention, there is provided a semiconductor memory device comprising a semiconductor memory circuit which includes a memory cell array including a plurality of memory cells arranged in a matrix form each constituted of a cell transistor and a paraelectric capacitor having one end connected to a source of the cell transistor, a plurality of word lines connected to gates of the cell transistors of the memory cells, a plurality of pairs of bit lines connected to drains of the cell transistors of the memory cells, a plate line connected to the other end of the paraelectric capacitor, and a plurality of sense amplifier circuits each connected to a corresponding pair of bit lines; and a control circuit which controls the semiconductor memory circuit in an operation time to raise the word lines to be selected from a first potential to a second potential to read cell data from the memory cells onto the bit lines, thereafter set the bit lines to a high level to write "1" data into the memory cells regardless of a logic level of data to be written, thereafter set the selected word lines to a third potential lower than the second potential and higher than the first potential, set the bit lines to a low level with "0" data to be written to write "0" data into the memory cells, and thereafter to lower the selected word lines to the first potential.

According to a third aspect of the present invention, there is provided a semiconductor memory device comprising a semiconductor memory circuit which includes a memory cell array including a plurality of memory cells arranged in a matrix form each constituted of a cell transistor and a ferroelectric capacitor having one end connected to a source of the cell transistor, a plurality of word lines connected to gates of the cell transistors of the memory cells, a plurality of pairs of bit lines connected to drains of the cell transistors of the memory cells, a plate line connected to the other end of the ferroelectric capacitor, and a plurality of sense amplifier circuits each connected to a corresponding pair of bit lines; and a control circuit which controls the semiconductor memory circuit in an operation time to raise the word lines to be selected from a first potential to a second potential to read cell data from the memory cells onto the bit lines, thereafter set the bit lines to a high level to write "1" data into the memory cells regardless of a logic level of data to be written, thereafter set the selected word lines to a third potential lower than the second potential and higher than the first potential, set the bit lines to a low level with "0" data to be written to write "0" data into the memory cells, and thereafter to lower the selected word lines to the first potential.

According to a fourth aspect of the present invention, there is provided a semiconductor memory device comprising a semiconductor memory circuit which includes a memory cell array including a plurality of memory cells arranged in a matrix form each constituted of a cell transistor and a ferroelectric capacitor having one end connected to a source of the cell transistor, a plurality of word lines connected to gates of the cell transistors of the memory cells, a plurality of pairs of bit lines connected to drains of the cell transistors of the memory cells, a plate line connected to the other end of the ferroelectric capacitor, and a plurality of sense amplifier circuits each connected to a corresponding pair of bit lines; and a control circuit which controls the semiconductor memory circuit in an operation time to raise the word lines to be selected from a first potential to a third potential and raise the plate line from the first potential to the third potential and subsequently lower the plate line to the first potential, amplify a signal by the sense amplifiers in this state, thereafter set the bit lines to a high level and raise the word line to a second potential higher than the third potential to write "1" into the memory cells regardless of a logic level of data to be written, thereafter lower the word line to the third potential, again raise the plate line to the third potential, thereafter set the bit line to a low level with "0" data to be written to write "0" data into the memory cells, and thereafter to lower the selected word lines to the first potential.

According to a fifth aspect of the present invention, there is provided a semiconductor memory device comprising a semiconductor memory circuit which includes a memory cell array including a plurality of memory cells in a matrix form each constituted of a cell transistor and a ferroelectric capacitor connected in parallel between source and drain terminals of the cell transistor, a plurality of word lines connected to gates of the cell transistors, a plurality of pairs of bit lines, a plurality of block selection transistors each connected between one end of the memory cells connected in series in a corresponding row and a corresponding bit line, a plurality of plate lines each connected to the other end of the memory cells connected in series in the corresponding row, and a plurality of sense amplifier circuits each connected to a corresponding pair of bit lines; and a control circuit which controls the semiconductor memory circuit in an operation time to raise gate potentials of the block selection transistors to be selected from a first potential to a second potential to read cell data from the memory cells of the selected block selection transistors onto the bit lines, thereafter set the bit lines to a high level to write "1" data into the memory cells regardless of a logic level of data to be written, thereafter set the gate potentials of the selected block selection transistors to a third potential lower than the second potential and higher than the first potential, set the bit line to a low level with "0" data to be written to write "0" data into the memory cells, and thereafter to lower the gate potentials of the selected block selection transistors to the first potential.

BRIEF DESCRIPTION OF THE SEVERAL VIEWS OF THE DRAWING

FIG. 1A shows a circuit diagram of a DRAM memory cell in a first embodiment of the present invention, and FIG. 1B shows a signal chart of the cell.

FIG. 2A is a DRAM circuit in a second embodiment of the present invention, and shows a DRAM circuit constitution for realizing an operation described with reference to FIGS. 1A, 1B. FIG. 2B is a block diagram of the DRAM circuit of FIG. 2A and a control circuit of the DRAM circuit.

FIG. 14A is a circuit diagram of the ferroelectric memory cell in a twelfth embodiment of the present invention, and FIG. 14B shows the signal chart.

FIG. 26A shows the row decoder circuit constitution applicable to the DRAM or the ferroelectric memory according to the respective embodiments, and FIG. 26B shows the signal chart.

DETAILED DESCRIPTION OF THE INVENTION

Figure 3:
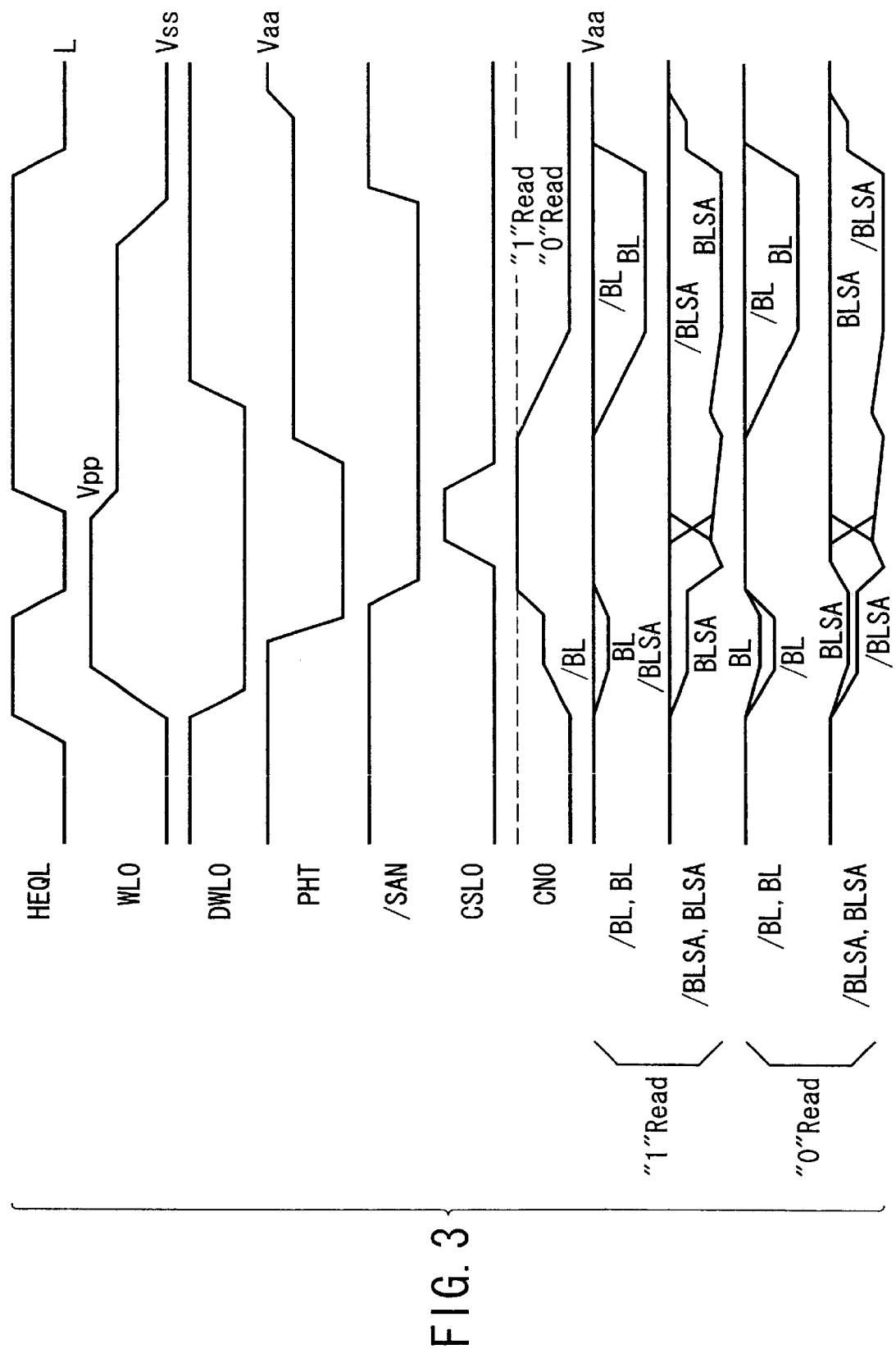
FIG. 3 is a signal chart of the circuit of FIG. 2.

Embodiments of the present invention will be described hereinafter with reference to the drawings.

First Embodiment

FIG. 1A shows a circuit diagram of a memory cell of a DRAM according to a first embodiment of the present invention, and FIG. 1B shows a related signal chart.

A memory cell has a constitution in which one cell transistor CT0 and one paraelectric capacitor CC0 are connected in series, one end of the memory cell is connected to a plate line PL, and the other end is connected to a bit line BL. As a paraelectric material, in addition to $SiO_2$, $Si_xN$, SiNO, TaO, BaSrTiO, and the like can be used.

When a bit line amplitude voltage is Vaa, the plate line is usually fixed at ½Vaa. An equivalent circuit of the cell is the same as that of a conventional DRAM.

FIG. 1B shows respective potentials of a word line WL, bit line BL, and cell node CN0, and a voltage WL–CN0 between word line and cell node. As shown in FIG. 1B, during standby, the bit line is pre-charged at Vaa. During an operation, a selected word line voltage is boosted, for example, to a high potential, that is, a boosted voltage Vpp from Vss (e.g., ground potential), a cell transistor is turned ON, and cell data is read into the bit line from the memory cell. In this case, the word line starts to rise to Vpp from Vss, data is "0" data, the data is read, and both the cell node CN0 and the bit line BL indicate a value Vaa–2Vs in which Vaa decreases by a read signal 2Vs. On the other hand, when the data is "1", the CN0 potential is Vaa, and there is no change. Here, a signal 2Vs is set. When a reference potential is set to Vaa–Vs, the signal of "1" and "0" is Vs. Therefore, a gate-source (WL–CN0) voltage or a gate-drain (WL–BL) voltage of the cell transistor is Vpp–vaa–2Vs with the "0" data, and is Vpp–Vaa at maximum with the "1" data. On the other hand, the voltage between drain and source (BL–CN0) is Vaa at maximum.

Subsequently, after the cell data is read, all the bit lines are precharged at Vaa. Thereby, the "1" data is written into all selected memory cells. In this case, a gate-source voltage or a gate-drain voltage of the cell transistor is Vpp–Vaa at maximum, and a source-drain voltage is 0V.

Subsequently, a word line voltage is lowered, for example, to vaa from Vpp. A bit line voltage is unchanged at Vaa, when written data is the "1" data. With the "0" data, the voltage is lowered to Vss. Thereby, when the cell data to be written is "1", the cell node CN0 is Vaa, and the bit line voltage is Vaa. Therefore, the voltage applied to the cell transistor drops. That is, the gate-source voltage of the cell transistor drops to 0V, the gate-drain voltage drops to 0V, and the source-drain voltage drops to 0V. On the other hand, in this case, when the cell data to be written is "0", and when the word line voltage Vaa is higher than a threshold voltage of the cell transistor (i.e., Vaa>Vtcell), Vss of the "0" data is propagated to the cell node CN0 from the bit line. Therefore, the cell node CN0 indicates Vss, the bit line voltage is Vss, and the voltage applied to the cell transistor therefore drops. That is, the gate-source voltage of the cell transistor is Vaa, the gate-drain voltage is Vaa, and the source-drain voltage drops to 0V. Thereafter, the word line is lowered to Vss, the bit line is precharged at Vaa, and a one-cycle operation ends.

According to the first embodiment, for the maximum voltage applied to the cell transistor, the gate-source voltage=gate-drain voltage=Vaa or Vpp–Vaa–2Vs. Moreover, the drain-source voltage=Vaa. When Vaa>Vtcell, a Vs value is of the order of 100 mV, Vpp–2Vs<2Vaa is normal, and a voltage of Vaa or more can be prevented from being applied to the cell transistor. That is, only the "1" data is written on a condition that the word line voltage is boosted. Therefore, source and drain voltages rise, and the high voltage is not applied to the cell transistor. On the other hand, when the "0" data is written, the word line voltage is lowered, and the high voltage is not applied to the cell transistor. Therefore, the threshold voltage of the cell transistor can sufficiently be raised. While the data holding time is maintained, the voltage applied to the memory cell transistor can be largely reduced. Moreover, reduction of a gate oxide film thickness, channel length L, and the like of the cell transistor can be realized, the cell size is reduced, and the chip size can be reduced. Furthermore, the size of the transistor can be reduced. When the memory cell is realized by a transistor having a performance as high as that of an LSI, voltage reduction, and speed increase can be achieved. Additionally, in a system in which the bit line is precharged at Vaa, power consumption increases as compared with a conventional system in which the bit line is precharged at ½Vaa. However, it is considered that the Vaa precharge system is inevitably employed broadly in future, and therefore the increase of power consumption is inevitable. That is, in recent years, the bit line amplitude of the DRAM has been less than 2V. In this situation, in the ½ Vdd precharge system, an operation condition of a sense amplifier transistor of NMOS or PMOS of a flip-flop type sense amplifier is ½Vaa–Vt>0. Therefore, the operation is difficult now, and the Vaa precharge system will inevitably be a mainstream.

Second Embodiment

FIG. 2A shows a DRAM circuit constitution for realizing the operation described with reference to FIGS. 1A, 1B. FIG. 2B is a block diagram showing the DRAM circuit of FIG. 2A and a control circuit of the DRAM circuit.

In the DRAM circuit of FIG. 2A, a circuit PRE for precharging bit lines BL and /BL of a cell array MA to Vaa, and a control signal HEQL are added to a usual DRAM constitution. Moreover, a PHT signal for separating a sense amplifier circuit S/A and cell array, and a separation transistor Ts are added. FIG. 2A shows a pair of bit lines BL and /BL and an associated constitution. However, in actuality, a large number of circuits constituted as shown in FIG. 2A are arranged in the word line direction to construct the memory cell array. This also applies to the following embodiments. Moreover, the word line is selected in a row, and CSL is selected in a column. The operation of the DRAM circuit of FIG. 2A is controlled by the control circuit of FIG. 2B. Since the constitution shown in FIG. 2B is similar to corresponding constitutions of the following embodiments, illustration and description thereof is omitted in the following embodiments.

Similarly as FIG. 1A, the memory cell has a constitution in which one cell transistor CT0 and one paraelectric capacitor CC0 are connected in series, one end is connected to the plate line (PL), and the other end is connected to the bit line (BL). Assuming that the bit line amplitude voltage is Vaa, the plate line is usually fixed at ½Vaa.

FIG. 3 shows a signal chart of the circuit of FIG. 2A. FIG. 3 shows an equalization signal HEQL, word line WL0, dummy word line DWL0, PHT signal, sense amplifier control signal/SAN, column selection signal CSL0, cell node CN0, bit lines BL and /BL on a cell array side, and bit lines BLSA and /BLSA on a sense amplifier side.

As shown in FIG. 3, during standby, HEQL is set to an L level, and the bit line is pre-charged at Vaa. During operation, the voltage of the selected word line WL0 is boosted, for example, to Vpp from Vss, the cell transistor is turned ON, and the cell data is read into the bit line from the memory cell. In this case, the word line starts to rise to Vpp from Vss, the data is simultaneously read, and the "0" data both in the cell node CN0 and bit line/BL indicates a value Vaa−2Vs decreased from Vaa by the read signal 2Vs. On the other hand, the "1" data has a CN0 potential of Vaa, and there is unchanged. Here, the reference potential DWL0 is lowered, Vaa−Vs is generated, and the signal of "1" or "0" is therefore Vs. Therefore, the gate-source (WL−CN0) voltage or the gate-drain (WL0−/BL) voltage of the cell transistor is Vpp−Vaa−2Vs at maximum with the "0" data, and is Vpp−Vaa at maximum with the "1" data. The voltage between drain and source (/BL−CN0) is Vaa at maximum.

After the cell data is read in this manner, the PHT signal is lowered to Vss from Vpp, the separation transistor disposed in the bit line between the sense amplifier circuit and the cell array is turned OFF<HEQL is lowered again, and all the bit lines on the cell region side are precharged. Thereafter, the "1" data can be written into all the selected memory cells. In this case, the gate-source voltage or the gate-drain voltage of the cell transistor is Vpp−Vaa at maximum, and the source-drain voltage is 0V.

Moreover, while the separation transistor is OFF, on the sense amplifier side, /SAN is lowered, the read data is amplified, CSL0 is raised, and the cell data is read outside a chip. Alternatively, CSL0 is raised, and external data is written into h cell data is read outside a chip. Alternatively, CSL0 is raised, and external data is written into the sense amplifier via DQ and /DQ lines. According to this operation, the bit line on the sense amplifier side indicates Vaa with the "1" data, and Vss with the "0" data. Thereafter, HEQL is set to H level, and equalization to Vaa is canceled. Subsequently, the word line voltage is lowered, for example, to Vaa from Vpp, PHT is then raised to Vaa, and the separation transistor is turned ON. In this case, when the cell data to be written is "1" data, the cell node CN0 indicates Vaa, the bit line voltage on the cell array side is Vaa, and the bit line voltage on the sense amplifier side is Vaa. Therefore, the voltage applied to the cell transistor drops. That is, the gate-source voltage of the cell transistor is 0V, the gate-drain voltage is 0V, and the source-drain voltage drops to 0V.

Moreover, in this case, when the data to be written is "0" data, and when the word line voltage Vaa is higher than the threshold voltage of the cell transistor (i.e., Vaa>Vtcell), and the gate voltage Vaa of the separation transistor is higher than the threshold voltage of the separation transistor (i.e., Vaa>Vt), Vss of the "0" data is propagated to the cell array side and further to the cell node CN0 from the sense amplifier side. Therefore, the cell node CN0 indicates Vss, the bit line voltage on the cell array side is Vss, the voltage of the bit line on the sense amplifier side is Vss, and therefore the voltage applied to the cell transistor drops. That is, the gate-source voltage of the cell transistor is Vaa, the gate-drain voltage is Vaa, and the source-drain voltage drops to 0V. Thereafter, the voltage of the word line is lowered to Vss, the bit line is precharged at Vaa, and one-cycle operation ends.

Similarly as FIGS. 1A, 1B, in the operation shown in FIG. 3, only the "1" data is surely written on the condition that the word line voltage is boosted. On the other hand, when the "0" data is written, the word line voltage is lowered. Therefore, a voltage which is not less than Vaa is prevented from being applied to the cell transistor. Therefore, the threshold voltage of the cell transistor is sufficiently raised. While the data holding time is maintained, the voltage applied to the memory cell transistor is reduced, and the cell transistor and chip size can be reduced. Moreover, the size of the transistor can be reduced, and the memory cell can be realized by a transistor having a performance as high as that of an LSI, and a voltage reduction and speed increase can be achieved. Furthermore, in the constitution, during reading, BL, /BL, BLSA, /BLSA indicate Vaa or Vaa−2Vs, then PHT=Vpp is set. Moreover, during writing of the "0" data, when BL, /BL, BLSA, /BLSA indicate Vss, then PHT=Vaa is set. Therefore, a high voltage is not applied to the separation transistor. Additionally, the precharge circuit to Vaa is not disposed on the sense amplifier side. However, to return to the precharge, PHT=Vaa is unchanged, BL and /BL are set to Vaa, BLSA and /BLSA sides are first boosted to a potential of Vaa−Vt, and subsequently PHT=Vpp is set. Thereby, without applying the high voltage to the separation transistor, the BLSA and /BLSA sides can be precharged at Vaa. Additionally, the equalization circuit to Vaa may also be disposed on the sense amplifier side.

Third Embodiment

Figure 4:
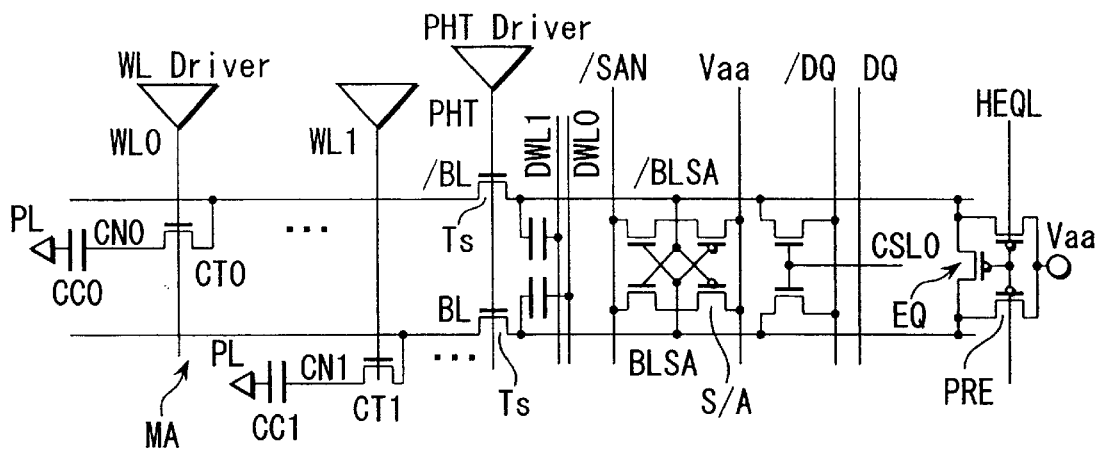
FIG. 4 is a diagram similar to that of FIG. 2, showing the DRAM circuit in a third embodiment of the present invention, and shows another circuit constitution for realizing the operation described with reference to FIGS. 1A, 1B.
Figure 5:
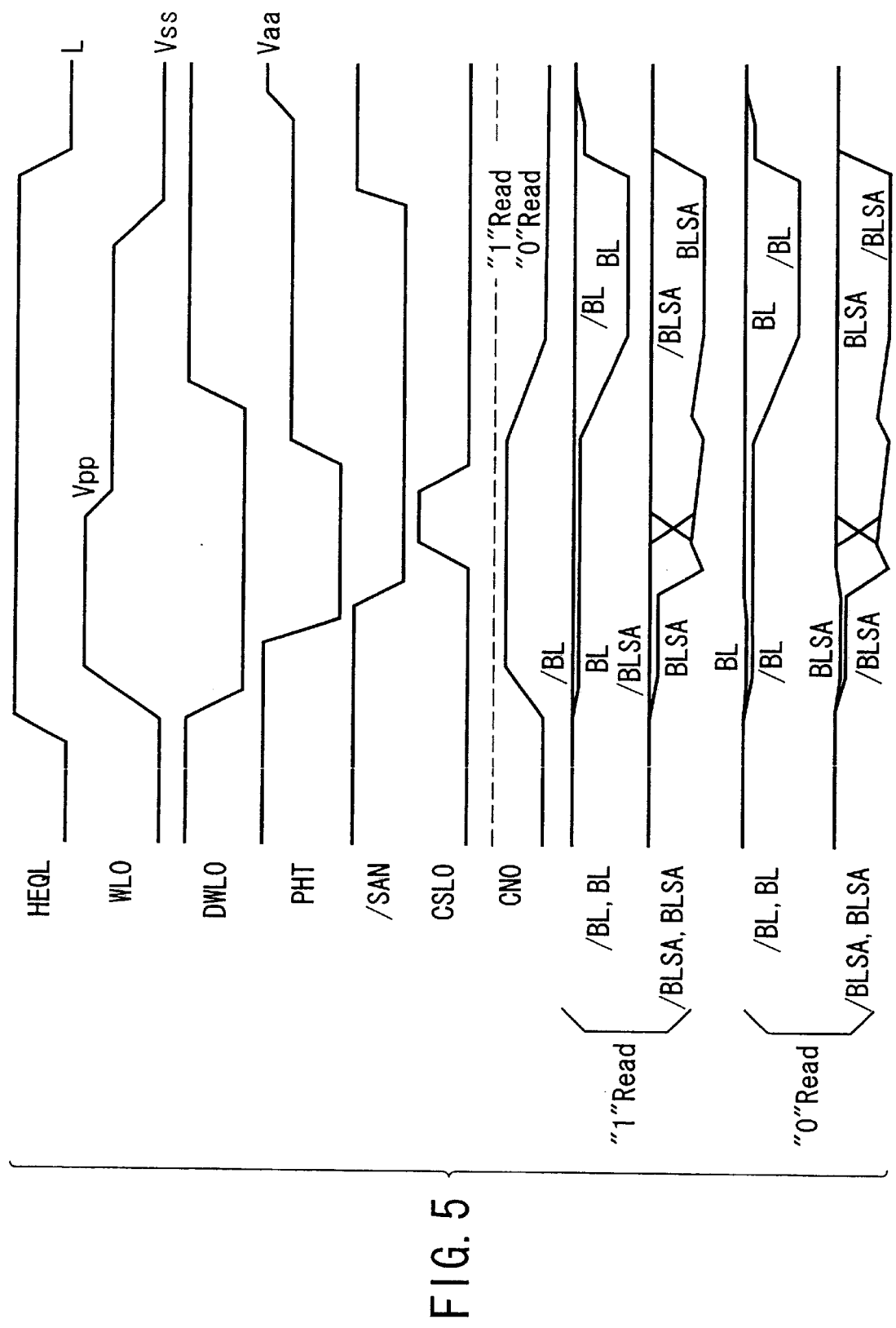
FIG. 5 shows the signal chart of the circuit of FIG. 4.

FIG. 4 shows a modification example of the circuit constitution shown in FIG. 2A. This example is different from the circuit constitution shown in FIG. 2A in that an equalization circuit EQ to Vaa is disposed on the sense amplifier side. This constitution can realize an effect similar to the effect of the circuit constitution shown in FIG. 2A. FIG. 5 shows the signal chart of the circuit of FIG. 4. The circuit operates and produces the effect similarly as FIG. 3, but is different from the circuit of FIG. 3 in that HEQL remains at the H level in an active state. Moreover, it is unnecessary to equalize the bit lines /BL and BL to be Vaa, after the cell data is read and PHT is lowered. Assuming that a bit line capacity is Cb, and a cell capacity is Cs, usually Cb/Cs=5 to 10. Furthermore, the bit line is precharged at Vaa during standby. Therefore, after the "0" data is read, the bit line potential is Cb*Vaa/(Cb+Cs)=0.83 Vaa to 0.9 Vaa. Without equalization to Vaa, the "0" data can substantially be written as "1". Of course, during reading of the "1" data, since the cell node indicates Vaa, there is no problem.

As described above, the embodiments of FIGS. 4 and 5 are effective systems for the DRAM which has a large Cb/Cs ratio. According to the embodiment system, while the effect is produced similarly as the embodiments of FIGS. 1 to 3, the Vaa equalization can be disposed on the sense amplifier side, the circuit on the sense amplifier side can be shared by the cell arrays on opposite sides, and the chip size can be reduced as much.

Fourth Embodiment

Figure 6A:
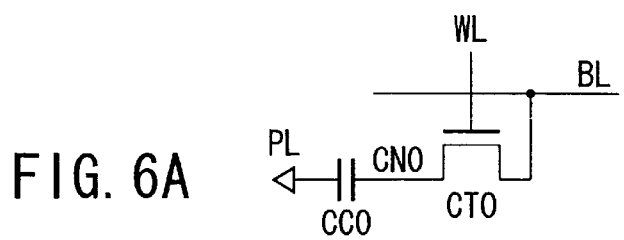
FIG. 6A is a circuit diagram of the DRAM memory cell in a fourth embodiment of the present invention.
Figure 6B:
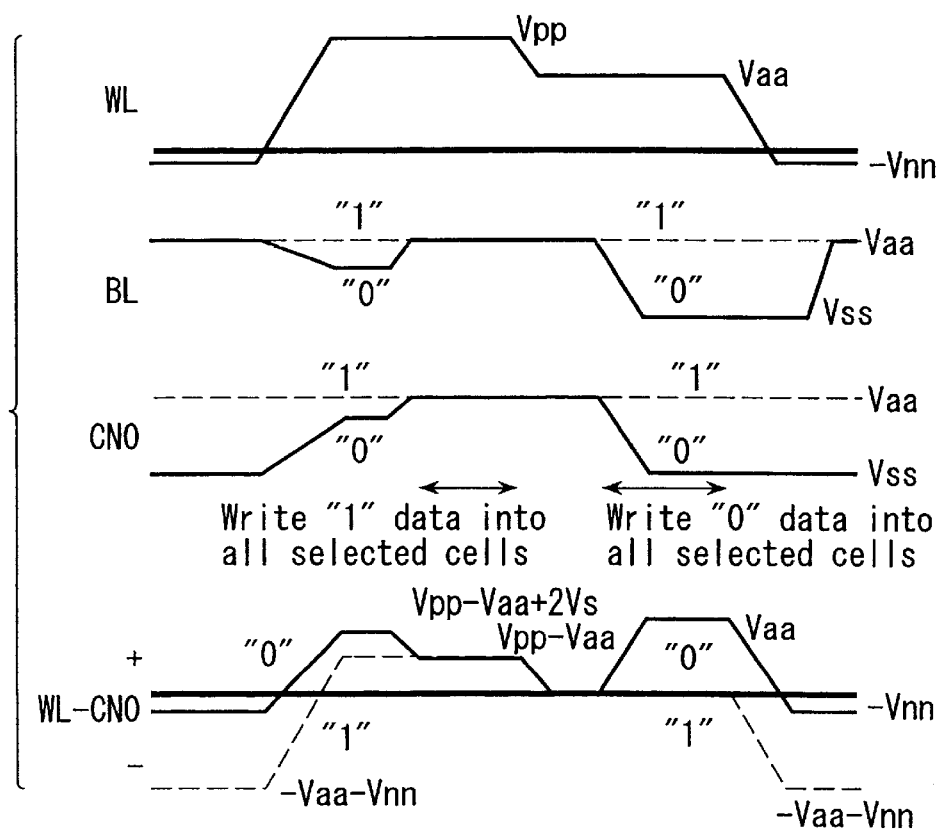
FIG. 6B shows the signal chart.

FIG. 6A shows a circuit constitution of the DRAM memory cell in a fourth embodiment of the present invention, and FIG. 6B shows the signal chart.

The memory cell has a constitution in which one cell transistor CT0 and one paraelectric capacitor CC0 are connected in series, one end is connected to the plate line PL, and the other end is connected to the bit line BL. As the paraelectric material, in addition to $SiO_2$, $Si_xN$, SiNO, TaO, BaSrTiO, and the like can be used.

The circuit constitution of the memory cell of the DRAM in the fourth embodiment is substantially the same as the circuit constitution of the memory cell of the DRAM in the first embodiment of FIG. 1A. Moreover, the signal chart is substantially the same as the signal chart in FIG. 1B.

The fourth embodiment is different from the first embodiment shown in FIGS. 1A and 1B in that the word line potential is set to a negative potential (−Vnn) during standby. Thereby, when the cell transistor is OFF, the voltage between gate and source is kept negative (−Vnn), and the transistor is further deeply OFF. Therefore, the threshold voltage Vtcell of the cell transistor drops, and the boosted potential Vpp drops. In this manner, it is possible to combine the system in which the word line is kept at the negative potential with the embodiments shown in FIGS. 1A, 1B.

A WL−CN0 potential on a "1" data side is (−Vaa−Vnn) during standby. On the other hand, in an active state, when the word line is raised to Vpp, the potential is (Vpp−Vaa+2Vs). In a relation of a work function, an actual positive/negative bias between gate and channel changes. Therefore, when the word line voltage is biased to be slightly negative, a stress electric field is small. Moreover, when Vtcell is lowered, a substrate bias effect decreases, and the Vpp+Vnn value is reduced. There is an effect that the stress electric field of a core circuit decreases.

Fifth Embodiment

Figure 7A:
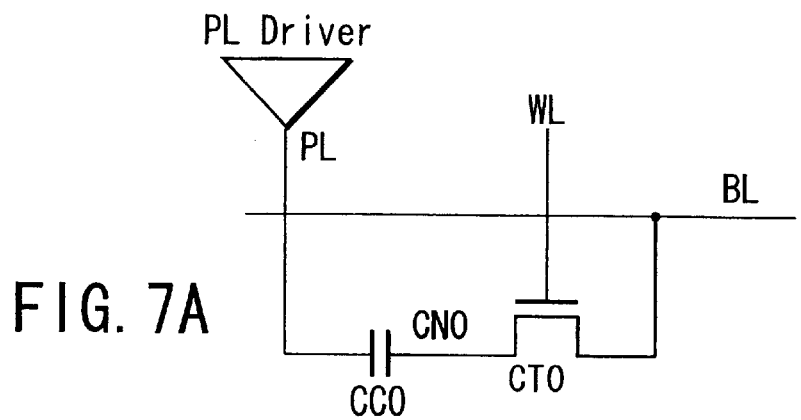
FIG. 7A is a circuit diagram of the DRAM memory cell in a fifth embodiment of the present invention.
Figure 7B:
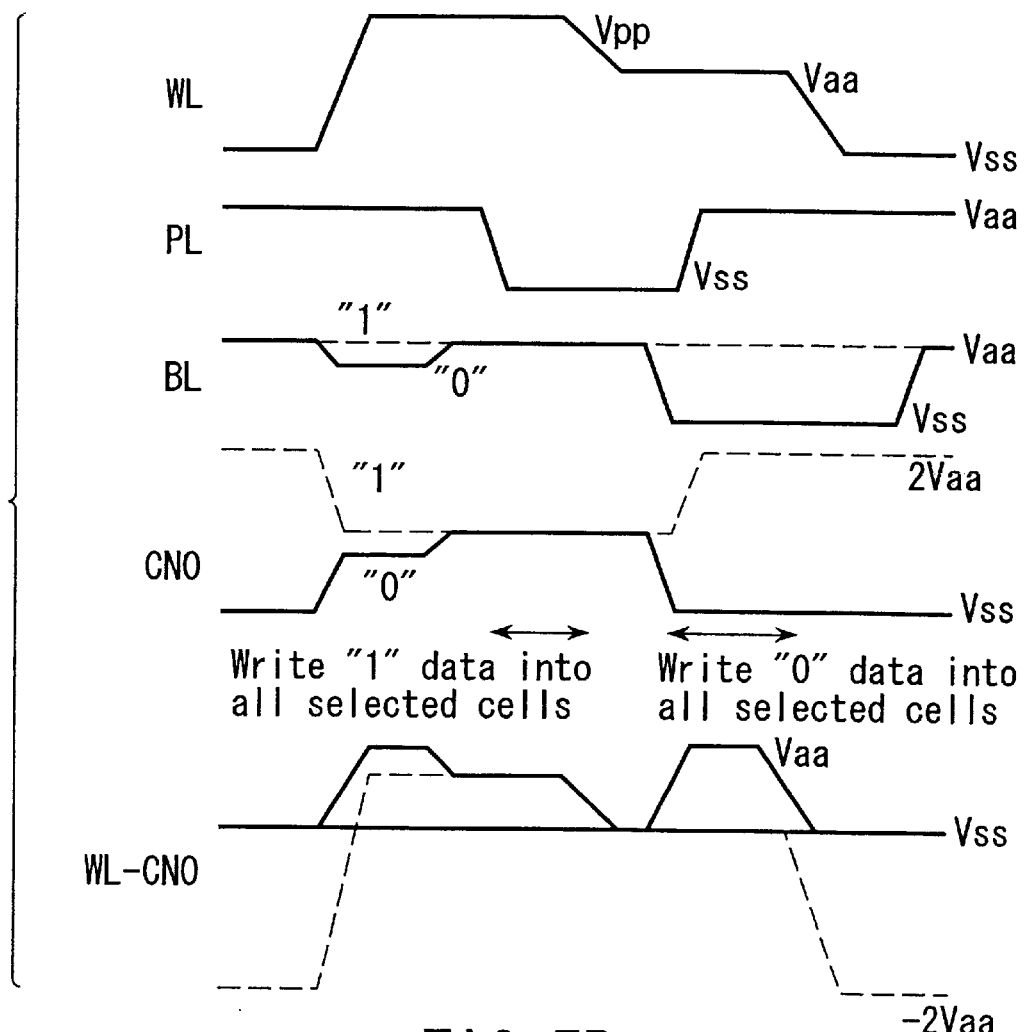
FIG. 7B shows the signal chart.

FIG. 7A shows a circuit constitution of the memory cell of the DRAM in a fifth embodiment of the present invention, and FIG. 7B shows the signal chart.

The circuit constitution of the memory cell of the DRAM in the fifth embodiment is substantially the same as the circuit constitution of the memory cell of the DRAM in the first embodiment of FIG. 1A. Moreover, the signal chart is substantially the same as the signal chart in FIG. 1B.

The fifth embodiment is different from the first embodiment in FIGS. 1A, 1B in that the plate line PL is driven between Vss and Vaa. That is, in the fifth embodiment, the plate line PL is set to a high level (Vaa) of the bit line potential during standby, and is lowered to a low level (Vss) from the high level (Vaa) during the operation. In the first embodiment of FIGS. 1A, 1B, the plate line PL is set to a voltage (½Vaa) between the high level (Vaa) and the low level (Vss).

Figure 29A:
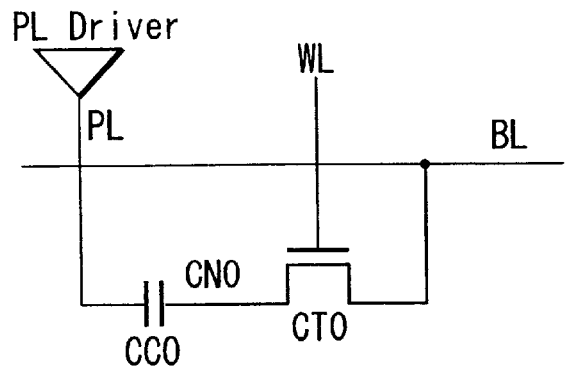
FIG. 29A shows another circuit constitution of the conventional DRAM.
Figure 29B:
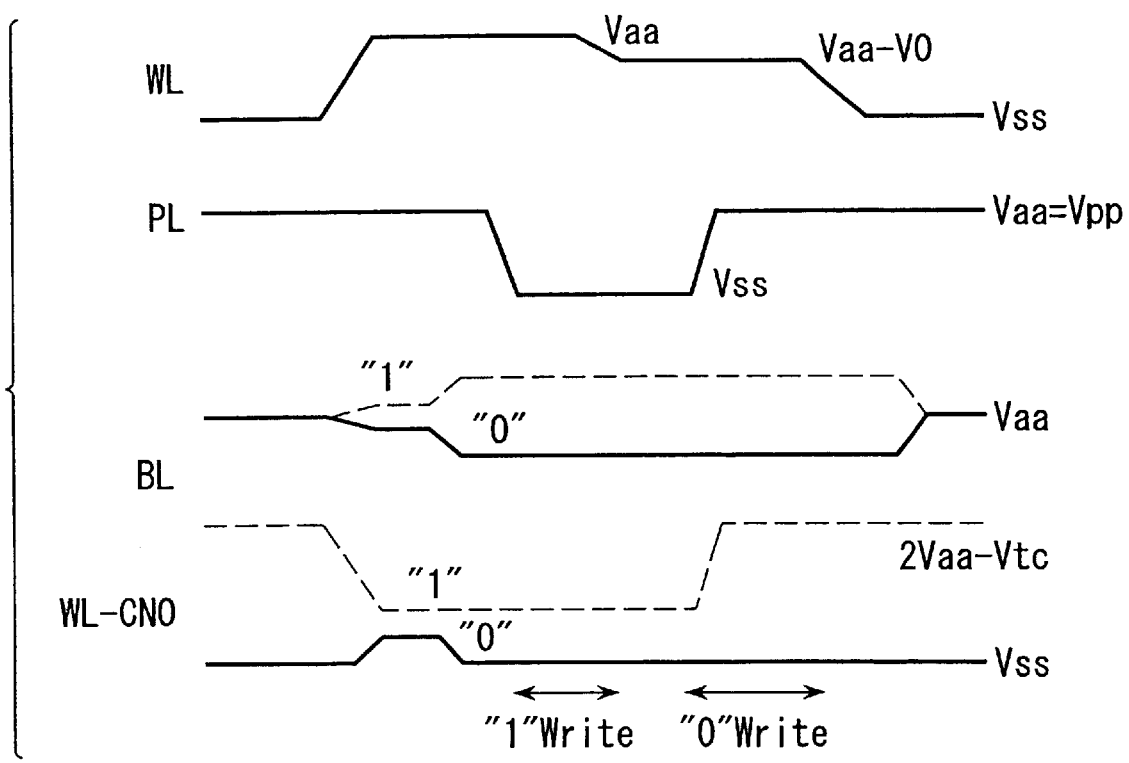
FIG. 29B shows the signal chart.

In the conventional plate line driving system of FIGS. 29A, 29B, the difference between the "1" data and the "0" data is 2Vaa−Vtcell, and is not more than the threshold value. However, in the fifth embodiment, with a combination of the plate driving with the invention of FIG. 1, a difference (WL−CN0) between the "1" data and the "0" data can be raised to 2 Vaa, and is not less than the threshold value.

Sixth Embodiment

Figure 8A:
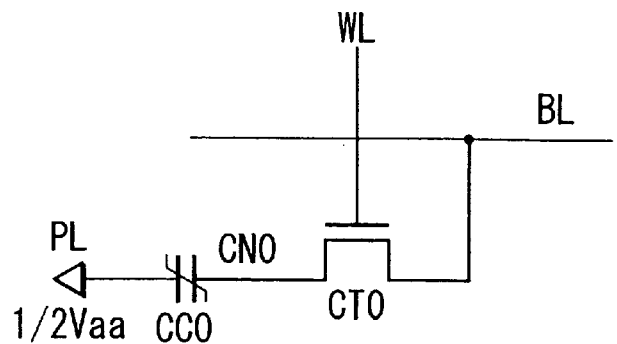
FIG. 8A is a circuit diagram of a ferroelectric memory cell in a sixth embodiment of the present invention.
Figure 8B:
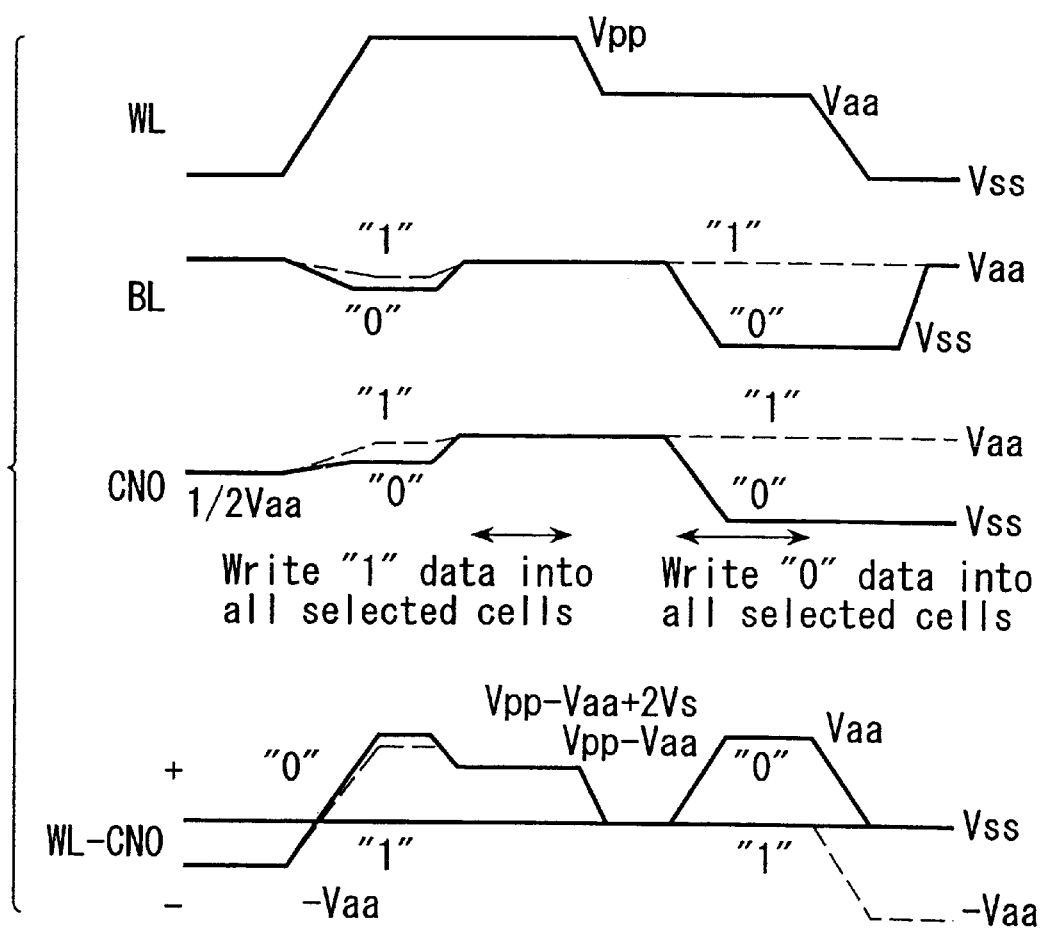
FIG. 8B shows the signal chart.

FIG. 8A shows a circuit constitution of a ferroelectric memory cell in a sixth embodiment of the present invention, and FIG. 8B shows the signal chart.

The memory cell has a constitution in which one cell transistor CT0 and one ferroelectric capacitor CC0 are connected in series, one end is connected to the plate line PL, and the other end is connected to the bit line BL. Examples of a ferroelectric material include PbZrTiO, SrBiTaO, and the like. Assuming that the bit line amplitude voltage is Vaa, the plate line is usually fixed at ½Vaa.

FIG. 8B shows the respective potentials of the word line WL, bit line BL, and cell node CN0, and the voltage WL−CH0 between word line and cell node. As shown in FIG. 8B, the bit line is precharged at Vaa during standby. During operation, the selection word line voltage is raised to a high potential, that is, a boosted potential Vpp from Vss (e.g., ground potential), the cell transistor is ON, and the cell data is read into the bit line from the memory cell. In this case, when the word line starts to rise to Vpp from Vss, and when the data is the "0" data, the potentials of both the cell node CN0 and the bit line BL simultaneously drop from Vaa by a polarized/reversed charge (Pr*Cb) by reading of the data, and indicate Vaa−V0. On the other hand, when the data is the "1" data, polarization/reverse does not occur, and the potential slightly drops by the charge of the paraelectric component, and indicates Vaa−V1. Therefore, the gate-source (WL−CN0) and gate-drain (WL−BL) voltages of the cell transistor are both Vpp−Vaa−V0 at maximum with the "0" data, and Vpp−Vaa−V1 at maximum with the "1" data. Moreover, the source-drain (BL−CN0) voltage is Vaa at maximum.

Subsequently, after the cell data is read, all the bit lines are precharged at Vaa. Thereby, the "1" data is written into all the selected memory cells. In this case, the gate-source voltage and gate-drain voltage of the cell transistor are both Vpp−Vaa at maximum, and the source-drain voltage is 0V.

Subsequently, the word line voltage is lowered, for example, to Vaa from Vpp. The bit line voltage is unchanged at Vaa when the written data is the "1" data, and is lowered to Vss with the "0" data. Thereby, when the written cell data is "1", the cell node CN0 indicates Vaa, the bit line voltage is Vaa, and the voltage applied to the cell transistor therefore drops. That is, the gate-source voltage of the cell transistor is 0V, the gate-drain voltage is 0V, and the source-drain voltage drops to 0V. On the other hand, in this case, when the data to be written is "0", and when the word line voltage Vaa is higher than the threshold voltage of the cell transistor (i.e., Vaa>Vtcell), Vss of the "0" data is propagated to the cell node CN0 from the bit line. Therefore, the cell node CN0 indicates Vss, the bit line voltage is Vss, and therefore the voltage applied to the cell transistor drops. That is, the gate-source voltage of the cell transistor is Vaa, the gate-drain voltage is Vaa, and the source-drain voltage drops to 0V. Thereafter, the voltage of the word line is lowered to Vss, the bit line is precharged at Vaa, and one-cycle operation ends.

According to the sixth embodiment, for the voltage applied to the cell transistor, at maximum, the gate-source voltage=gate-drain voltage=Vaa or Vpp−Vaa−V0. Moreover, the source-drain voltage=Vaa. When Vaa>Vtcell, V0 value is of the order of 500 mV, Vpp−V0<2Vaa is normal, and a voltage not less than Vaa can be prevented from being applied to the cell transistor. That is, the "1" data is only written on the condition that the word line voltage is boosted. Therefore, the source and drain voltages rise, and the high voltage is not applied to the cell transistor. On the other hand, when the "0" data is written, the word line voltage is lowered, and the high voltage is not applied to the cell transistor. Therefore, the threshold voltage of the cell transistor can sufficiently be raised. While the data holding time is maintained, the voltage applied to the memory cell transistor can largely be reduced. Moreover, reduction of the gate oxide film thickness, channel length L, and the like of the cell transistor can be realized, the cell size is reduced, and the chip size can be reduced. Furthermore, the size of the transistor can be reduced. When the memory cell is realized by the transistor having a performance as high as that of an LSI, voltage reduction and speed increase can be achieved. Additionally, in the sixth embodiment, the plate line is fixed at ½Vdd. Therefore, when CN0 of the "1" data drops to Vss, cell polarization is broken, and therefore the cell needs to be refreshed.

Seventh Embodiment

Figure 9:
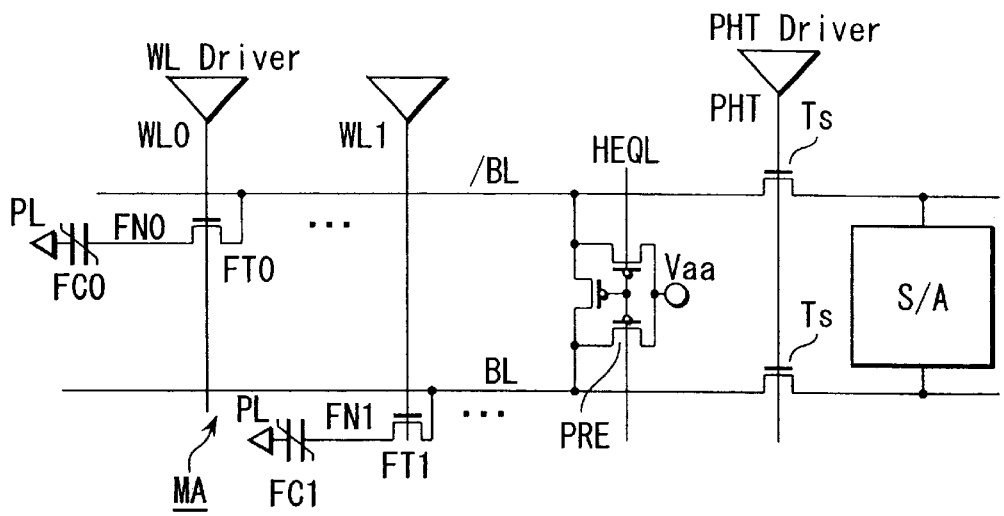
FIG. 9 shows a ferroelectric memory circuit in a seventh embodiment of the present invention, and shows a circuit constitution example for realizing the operation described with reference to FIGS. 8A, 8B.

FIG. 9 shows a circuit constitution example for realizing the operation described with reference to FIGS. 8A, 8B.

In the circuit of FIG. 9, a circuit for precharging the bit lines BL and /BL at Vaa and the control signal HEQL are added. Moreover, the PHT signal for separating the sense amplifier circuit and the cell array, and the separation transistor are added. The PHT operation is similar to the PHT operation in FIG. 2. The HEQL operation is also similar to the PHT operation in FIG. 2.

FIG. 8 shows a pair of bit lines BL and /BL and an associated constitution. However, in actuality, a large number of circuits constituted as shown in FIG. 8 are arranged in the word line direction to form the memory cell array.

Eighth Embodiment

Figure 10A:
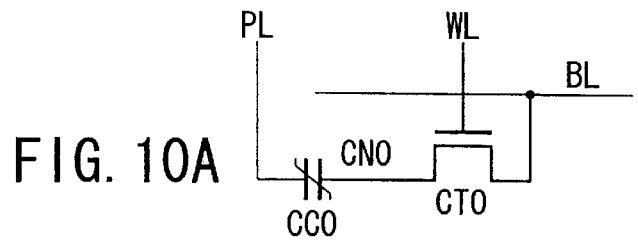
FIG. 10A is a circuit diagram of the ferroelectric memory cell in an eighth embodiment of the present invention.
Figure 10B:
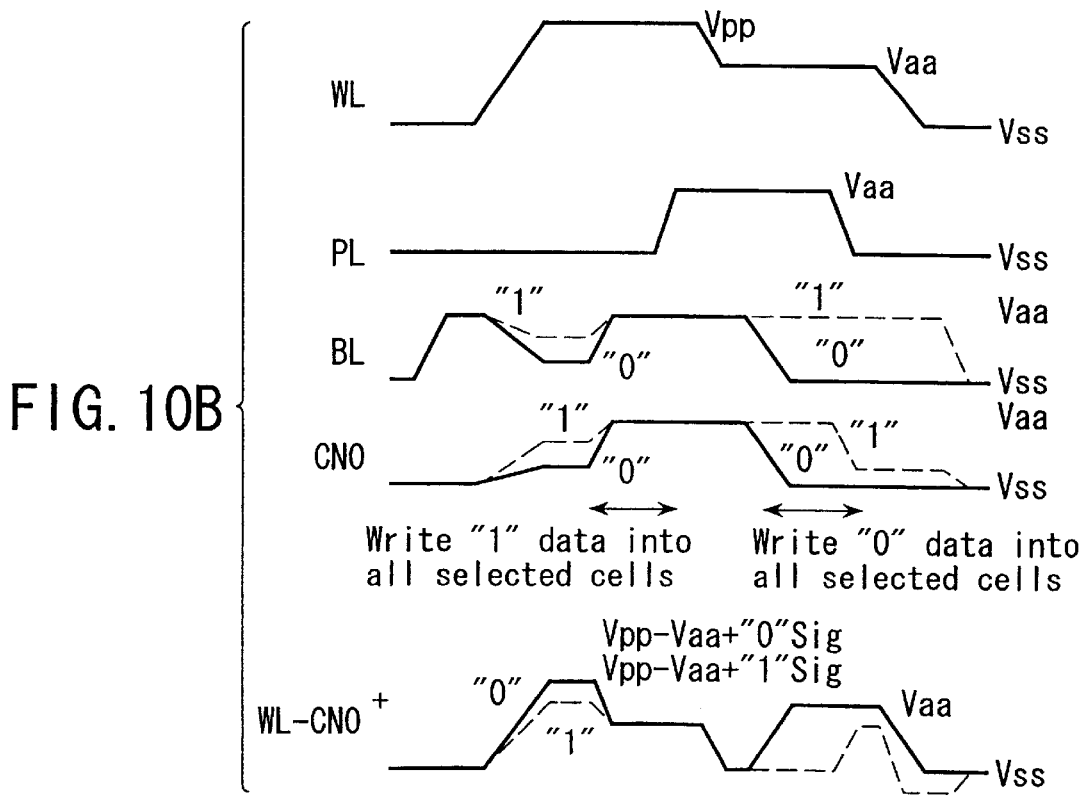
FIG. 10B shows the signal chart.

FIG. 10A shows the circuit constitution of the ferroelectric memory cell in an eighth embodiment of the present invention, and FIG. 10B shows the signal chart.

The memory cell has a constitution in which one cell transistor CT0 and one ferroelectric capacitor CC0 are connected in series, one end is connected to the plate line PL, and the other end is connected to the bit line BL. Examples of the ferroelectric material include PbZrTiO, SrBiTaO, and the like.

The circuit constitution of the memory cell in the eighth embodiment is substantially the same as the circuit constitution of the memory cell in the sixth embodiment of FIG. 8A. Moreover, the signal chart is substantially the same as the signal chart in FIG. 8B.

The eighth embodiment is different from the sixth embodiment in FIGS. 8A, 8B in that the plate line PL is driven between Vss and Vaa. In the conventional ferroelectric memory, the system in which the plate line PL is driven between Vss and Vaa is employed. However, in the eighth embodiment, when the plate line is driven, it is possible to raise the difference between the voltages applied to the capacitor for the "1" data and the "0" data to 2 Vaa, and to suppress the voltage applied to the cell transistor to be not more than Vaa. Moreover, unlike the sixth embodiment of FIGS. 8A, 8B, it is unnecessary to refresh the cell.

As shown in FIG. 10A, the memory cell constitution is similar to that of FIG. 8A, but is different in that the plate line is separated for each cell.

The operation of the memory cell of FIG. 10A will be described with reference to the signal chart of FIG. 10B. FIG. 10B shows the respective potentials of the word line WL, plate line PL, bit line BL, and cell node CN0, and the voltage WL–CN0 between the word line and the cell node.

As shown in FIG. 10B, the bit line is precharged at Vaa during standby, and the plate line is set to Vss. Thereby, CN0 is stabilized at a potential of Vss by junction leak, and a refresh operation is unnecessary. In the active state, first the bit line BL is precharged to Vaa from Vss. Subsequently, the selection word line WL is raised, for example, to the boosted potential Vpp from Vss, and the cell transistor is turned ON. Thereby, the voltage of Vaa is applied between BL and PL, and the voltage is applied to the capacitor. As a result, the cell data is read into the bit line from the memory cell. In this case, when the word line starts to rise to Vpp from Vss, and when the data is the "0" data, the potentials of both the cell node CN0 and the bit line BL simultaneously drop to Vaa–V0 from Vaa by reading of the data by polarization/reverse. On the other hand, when the data is the "1" data, the potentials of the cell node CN0 and bit line BL both drops to Vaa–V1 from Vaa by the capacity of the paraelectric component. Therefore, the gate-source (WL–CN0) and gate-drain (WL–BL) voltages of the cell transistor are both Vpp–Vaa–V0, when the data is "0" data. On the other hand, when the data is the "1" data, the potentials are both Vpp–Vaa–V1 at maximum. Moreover, the voltage (BL–CN0) between drain and source is Vaa at maximum. Subsequently, after the cell data is read, all the bit lines are precharged again at Vaa. Thereby, the "1" data is written into all the selected memory cells. In this case, the gate-source voltage and gate-drain voltage of the cell transistor are both Vpp–Vaa at maximum, and the source-drain voltage is 0V.

Subsequently, the plate line PL is raised to Vaa from Vss, and further the word line voltage is lowered, for example, to Vaa from Vpp. The bit line voltage is unchanged at Vaa when the written data is the "1" data, and is lowered to Vss with the "0" data. Thereby, when the written cell data is "1", the cell node CN0 indicates Vaa, the bit line voltage is Vaa, and the voltage applied to the cell transistor therefore drops. That is, the gate-source voltage of the cell transistor is 0V, the gate-drain voltage is 0V, and the source-drain voltage drops to 0V. On the other hand, in this case, when the data to be written is "0", and when the word line voltage Vaa is higher than the threshold voltage of the cell transistor (i.e., Vaa>Vtcell), Vss of the "0" data is propagated to the cell node CN0 from the bit line. Therefore, the cell node CN0 indicates Vss, the bit line voltage is Vss, and therefore the voltage applied to the cell transistor drops. That is, the gate-source voltage of the cell transistor is Vaa, the gate-drain voltage is Vaa, and the source-drain voltage drops to 0V. Thereafter, the voltages of the plate line and word line are lowered to Vss, the bit line is precharged at Vss, and one-cycle operation ends.

Ninth Embodiment

Figure 11:
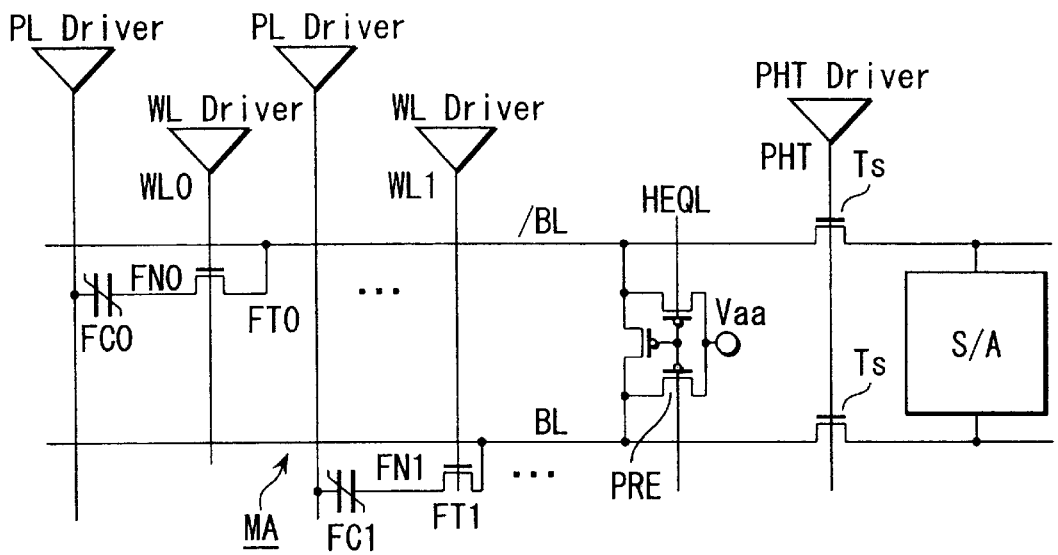
FIG. 11 shows the ferroelectric memory circuit in a ninth embodiment of the present invention, and shows a circuit constitution for realizing the operation described with reference to FIGS. 10A, 10B.

FIG. 11 shows a circuit constitution for realizing the operation described with reference to FIGS. 10A, 10B.

FIG. 11 shows a pair of bit lines BL and /BL and the associated constitution. However, in actuality, a large number of circuits constituted as shown in FIG. 11 are arranged in the word line direction to form the memory cell array.

This constitution is different from the ferroelectric memory of a conventional plate driving type in that a driving signal PHT for separating the bit line of the cell array and the bit line of the sense amplifier and the separation transistor are disposed. Additionally, the equalization circuit to Vaa is disposed on the memory cell side in FIG. 11, but may also be disposed on the sense amplifier side.

Tenth Embodiment

Figure 12A:
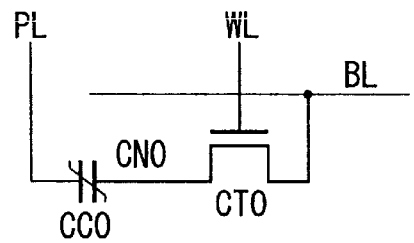
FIG. 12A is a circuit diagram of the ferroelectric memory cell in a tenth embodiment of the present invention.
Figure 12B:
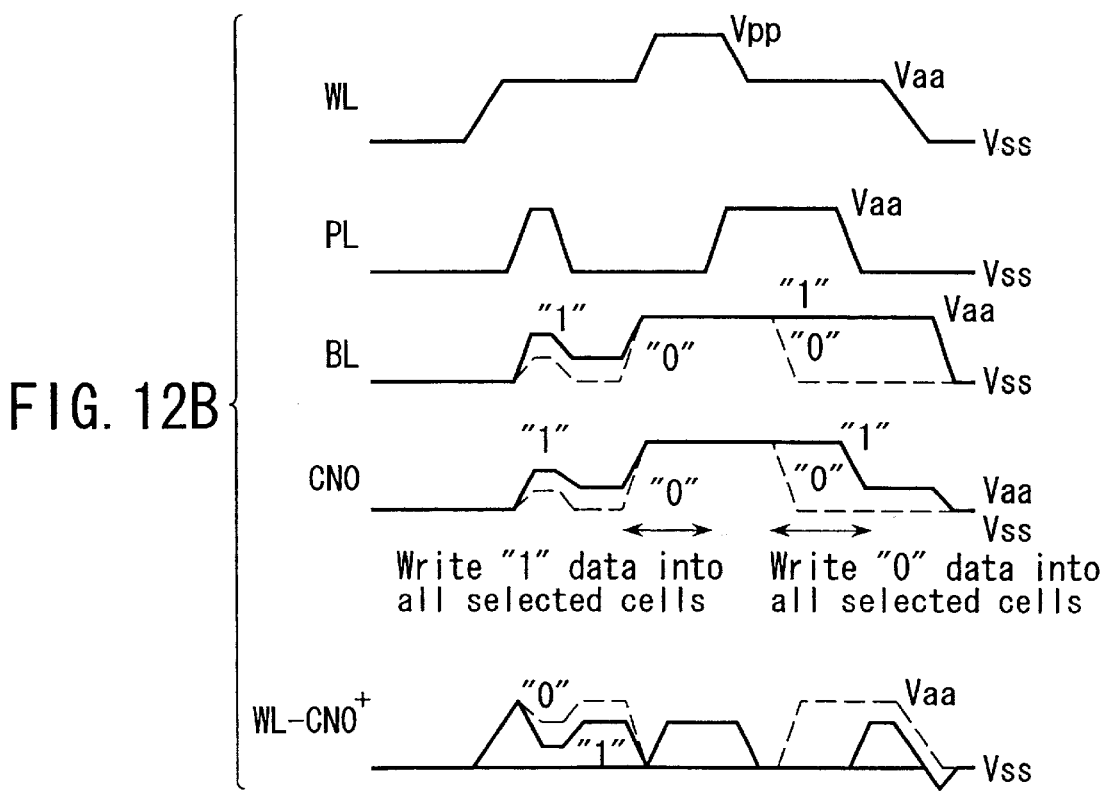
FIG. 12B shows the signal chart.

FIG. 12A shows a circuit constitution of the ferroelectric memory cell in a tenth embodiment of the present invention, and FIG. 12B shows the signal chart.

The memory cell has a constitution in which one cell transistor CT0 and one ferroelectric capacitor CC0 are connected in series, one end is connected to the plate line PL, and the other end is connected to the bit line BL. Examples of the ferroelectric material include PbZrTiO, SrBiTaO, and the like.

The circuit constitution of the memory cell in the tenth embodiment is substantially the same as the circuit constitution of the memory cell in the eighth embodiment of FIG. 10A. Moreover, the signal chart is substantially the same as the signal chart in FIG. 10B.

The tenth embodiment is different from the eighth embodiment shown in FIGS. 10A, 10B in that the plate line PL is once raised to Vaa from Vss, and is thereafter lowered to Vss, and the paraelectric component of the ferroelectric capacitor is eliminated. In this state, the signal is amplified by the sense amplifier, thereafter the bit line BL is raised to Vaa, the word line WL is raised to Vpp, and "1" is written into the memory cell. Thereafter, the word line WL is lowered to Vaa, the plate line is again raised to Vaa, and "0" is written into the memory cell. In this manner, the voltage applied to the cell transistor is reduced. As described above, the plate line is raised and lowered twice in the system of the embodiment.

Eleventh Embodiment

Figure 13A:
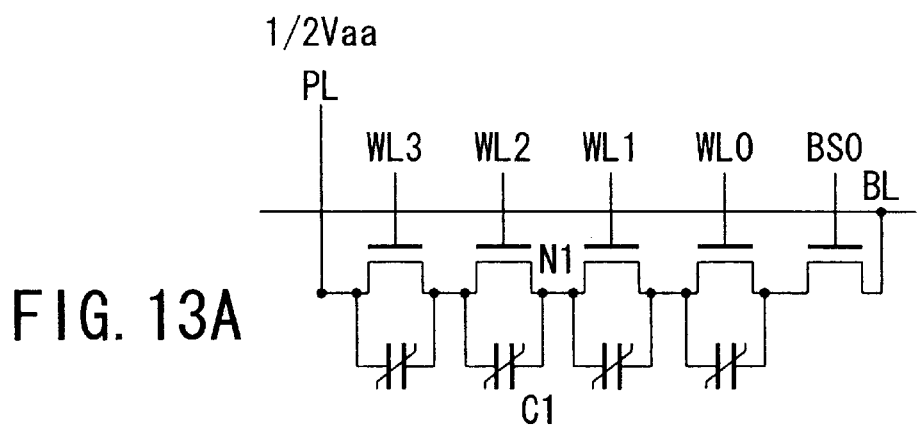
FIG. 13A is a circuit diagram of the ferroelectric memory cell in an eleventh embodiment of the present invention.
Figure 13B:
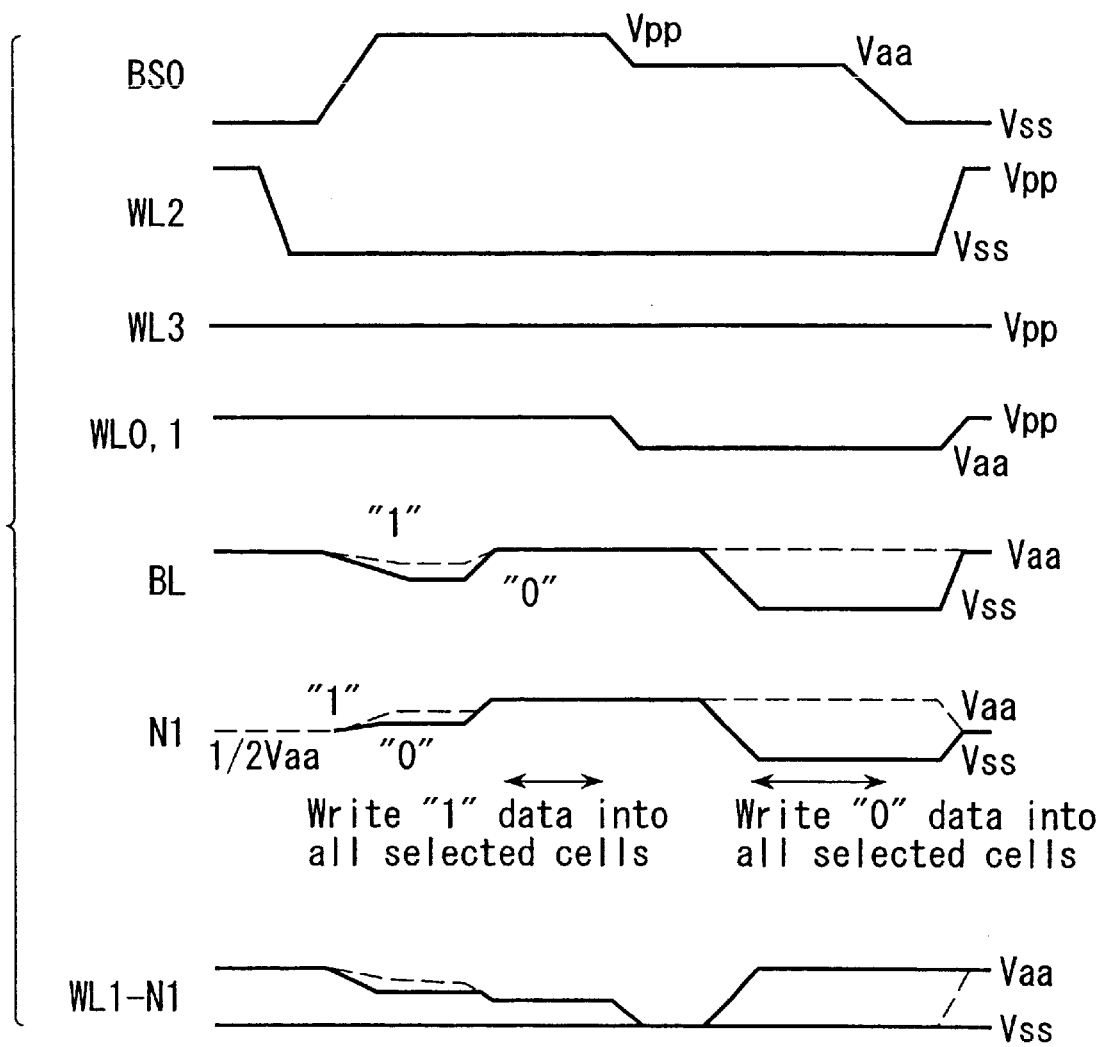
FIG. 13B shows the signal chart.

FIG. 13A shows a circuit diagram of the ferroelectric memory cell in an eleventh embodiment of the present invention, and FIG. 13B shows the signal chart. Similarly as the memory cell disclosed in U.S. Pat. No. 5,903,492 of the present inventor, the ferroelectric memory cell in the eleventh embodiment of FIG. 13A is constituted by connecting one cell transistor and one ferroelectric capacitor in parallel. One memory cell block is constituted by connecting a plurality of parallel connected memory cells in series, one end is connected to the bit line via a block selection transistor, and the other end is connected to the plate line. According to the constitution, a flat transistor can be used to realize the memory cell having a $4F^2$ size.

Even in this constitution, as shown in FIG. 13B, while the voltages of the word line and block selection line are boosted to Vpp, the "1" data is written. While the voltage is lowered to Vaa, the "0" data is written. Thereby, the voltages applied to the cell transistor and block selection transistor are reduced to be not more than Vaa. The cell transistor can be reduced, the cell size is reduced, and the chip size can be reduced.

In the eleventh embodiment, the plate line is fixed to ½Vaa. FIG. 13B shows a block selection signal BS0, the respective potentials of the word line WL, bit line BL, and cell node CN1, and a word line WL1-cell node voltage WL1-N1.

As shown in FIG. 13B, during the standby, the bit line is precharged at Vaa. At this time, all word line WL0-3 voltages are Vpp, block selection signal BS0 is Vss, and plate line PL voltage=½Vaa. Therefore, the gate-source voltage and gate-drain voltage of the cell transistor are Vpp−½Vaa. Therefore, with Vpp<1.5Vaa, the applied voltage can be less than Vaa. The source-drain voltage is 0V. For the voltage applied to the block selection transistor, the gate-source voltage=0V, gate-drain voltage=−Vaa, the source-drain voltage=Vaa, and the applied voltage is small.

When ferroelectric capacitor C1 data is read during the operation, a word line WL2 is lowered, for example, to Vss from Vpp, the block selection signal BS0 is raised to Vpp, the voltage of ½Vaa is applied to the selected ferroelectric capacitor, and the cell data is read into the bit line. At this time, each cell node potential changes in a direction so as to rise higher than ½Vaa. Therefore, the voltages applied to the boosted block selection signal BS0 and the transistors of the word lines WL0, WL1 change in a moderated direction. Subsequently, all the bit lines are precharged at Vaa. Thereby, the "1" data is written into all the selected memory cells. At this time, the gate-drain voltages and gate-source voltages of all the transistors on a bit line side of a selected cell are all Voo−Vaa. The gate-source voltage of the selected cell is −½Vaa, the gate-drain voltage is Vaa, and the source-drain voltage is ½Vaa. Moreover, the gate-drain voltages and gate-source voltages of all the cell transistors on the plate side of the selected cell are all Vpp−2Vaa, the source-drain voltage is 0V, and the voltages applied to all the transistors are therefore small. The word line voltages WL0 and WL1 and block selection signal BS0 on the bit line side of the selected cell are lowered, for example, to Vaa from Vpp. When the written data is the "1" data, the bit line voltage is unchanged at Vaa. The voltage is lowered to Vss with the "0" data. Thereby, when the cell data to be written is "1", the cell node CN1 has a voltage of Vaa, the bit line voltage is Vaa, and therefore the voltages applied to the transistors of the word lines WL0, WL1, BS0 drop. That is, the gate-source voltage of the transistor of the word line WL0, WL1, BS0 is 0V, the gate-drain voltage is 0V, and the source-drain voltage drops to 0V. On the other hand, when the cell data to be written is "0" at this time, and when the word line voltage Vaa is higher than the threshold voltage of the cell transistor or the block selection transistor (i.e., Vaa>Vtcell), Vss of the "0" data is propagated to the cell node CN1 from the bit line. Therefore, the cell node CN1 indicates Vss, the bit line voltage is Vss, and the voltages applied to the transistors of the word lines WL0, WL1, BS0 therefore drop. That is, the gate-source voltages of the transistors of the word lines WL0, WL1, BS0 are Vaa, the gate-drain voltage is Vaa, and the source-drain voltage drops to 0V. Thereafter, the block selection signal BS0 is lowered to Vss, the word line is raised to Vpp, the bit line is precharged at Vaa, and one-cycle operation ends. In this manner, the voltage applied to the cell transistor or the block selection transistor is Vaa or Vpp−½Vaa at maximum, and the conventional voltage of Vpp is not applied. Additionally, in this system, even when the plate line is fixed at ½Vdd during standby, the cell transistor having the ferroelectric capacitor ON is short-circuited, the cell data is not destroyed, and the refresh operation is unnecessary.

Twelfth Embodiment

FIG. 14A shows a circuit constitution of the ferroelectric memory in a twelfth embodiment of the present invention, and FIG. 14B shows the signal chart.

The embodiment is different from the embodiment of FIGS. 13A, 13B in that the word lines WL0 to WL3, BS0 are set to vaa during standby. With respect to the threshold voltage Vtcell of the cell transistor, Vpp−½Vaa>Vtcell. Then, even with PL=½Vdd, WLi=Vaa during the standby, the cell transistor is ON. That is, the word lines WL0 to WL3, BS0 may be at Vaa during the standby. Thereby, the applied voltage and power consumption during standby can be reduced. Moreover, in the embodiments of FIGS. 13A, 13B, 14A, 14B, it is seen that with Vpp–½Vaa>Vtcell in the active state, the word line voltage of the cell transistor on the plate side from the selected cell transistor may also be lowered to Vaa.

Thirteenth Embodiment

Figure 15:
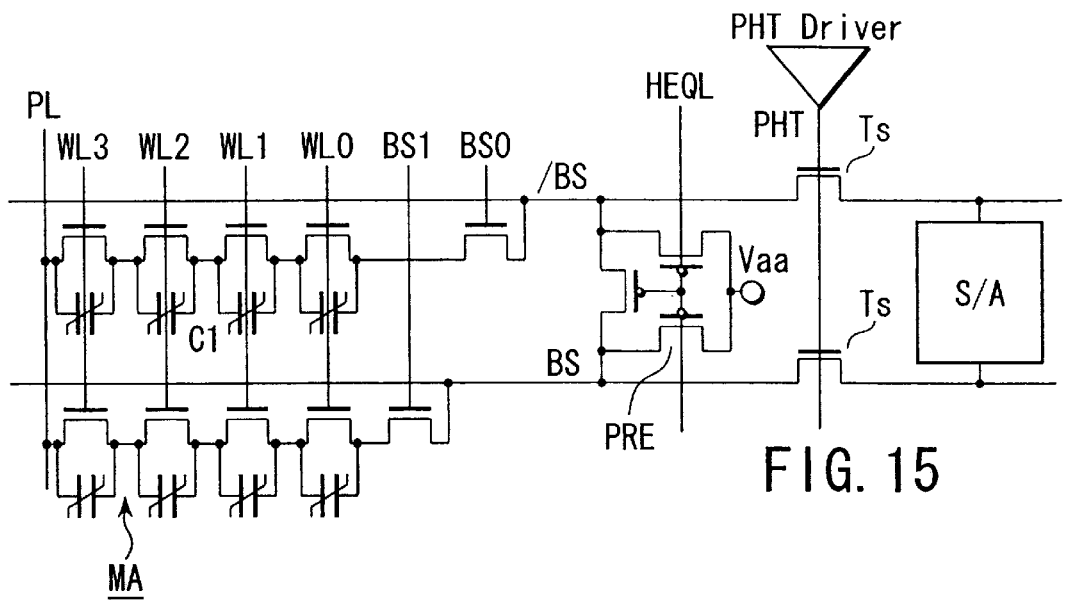
FIG. 15 shows the ferroelectric memory circuit in a thirteenth embodiment of the present invention, and shows a circuit constitution for realizing the operation described with reference to FIGS. 13A, 13B, or 14A, 14B.

FIG. 15 shows the circuit constitution for realizing the operation described with reference to FIGS. 13A, 13B, or 14A, 14B.

FIG. 15 shows a pair of bit lines BL and /BL and the associated constitution. However, in actuality, a large number of circuits constituted as shown in FIG. 15 are arranged in the word line direction to form the memory cell array.

In the circuit of FIG. 15, the separation transistor between cell array and sense amplifier and the precharge circuit to Vaa on the cell array side are connected to the sense amplifier circuit disclosed in the U.S. Pat. No. 5,903,492 of the present inventor.

Fourteenth Embodiment

Figure 16A:
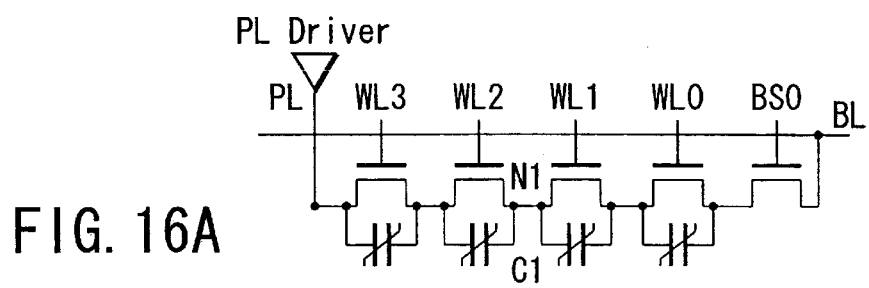
FIG. 16A is a circuit diagram of the ferroelectric memory cell in a fourteenth embodiment of the present invention.
Figure 16B:
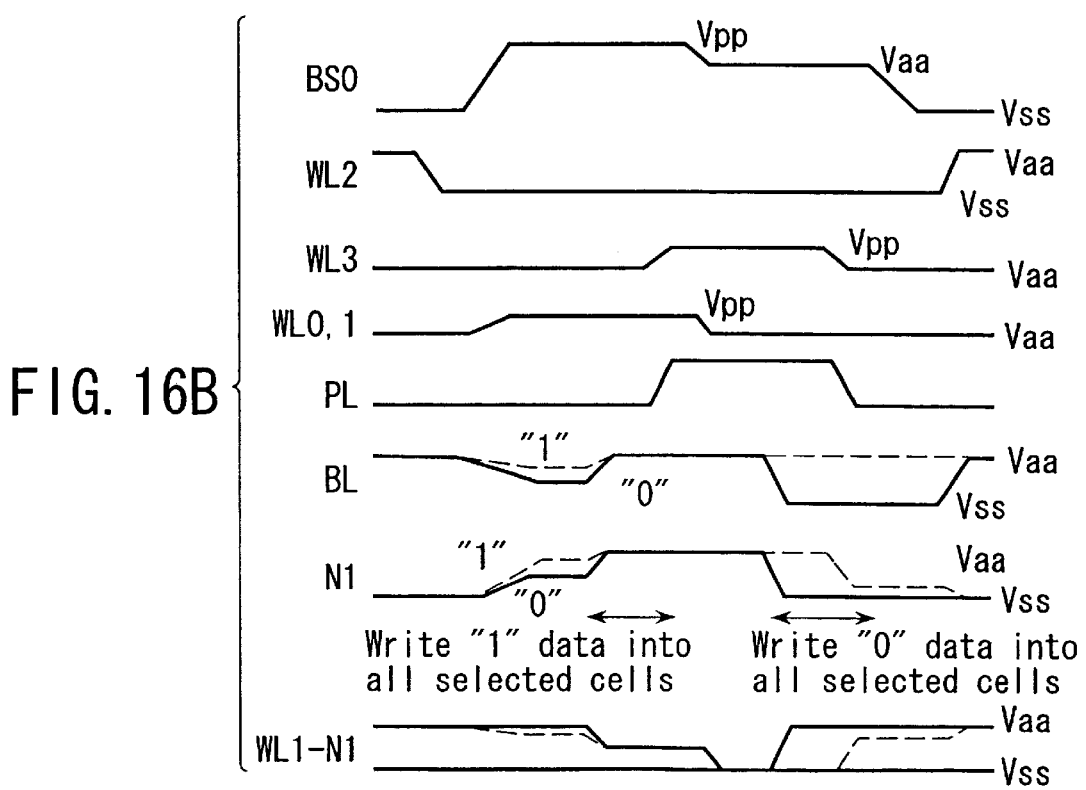
FIG. 16B shows the signal chart.

FIG. 16A shows a circuit constitution of the ferroelectric memory in a fourteenth embodiment of the present invention, and FIG. 16B shows the signal chart.

The embodiment is different from the embodiment of FIGS. 13A, 13B in that the plate line is driven between Vss and Vaa, a voltage of 2Vaa applied to the cell capacitor is secured between the "1" data and the "0" data. While further a large signal and low voltage operation is realized, the voltages applied to the cell transistor and block selection transistor are moderated.

As shown in FIG. 16B, the bit line is precharged at Vaa during standby. At this time, all word lines WL0 to 3 voltages are Vaa, the block selection signal BS0 is Vss, and plate line PL voltage=0V. Therefore, the gate-source voltage and gate-drain voltage of the cell transistor are Vaa, and the applied voltage can be moderated. The source-drain voltage is 0V. The voltage applied to the block selection transistor is small. That is, the gate-source voltage of the block selection transistor=0V, the gate-drain voltage=–Vaa, and the source-drain voltage=Vaa. All applied voltages are small.

When the ferroelectric capacitor C1 data is read during operation, the word line WL2 is lowered, for example, to Vss from Vaa. The block selection signal BS0 is raised to Voo, the voltage of Vaa is applied to the selected ferroelectric capacitor, and the cell data is read into the bit line. At this time, each cell node potential rises to be higher than 0V, and the voltages applied to the transistors of the boosted block selection signal BS0 and word lines WL0, WL1 change in a moderated direction. Subsequently, after the "0" or "1" data is read, the cell data is read, and all the bit lines are precharged at Vaa. Thereby, the "1" data is written into all the selected memory cells. At this time, the gate-drain voltage and gate-source voltage of all the transistors on the bit line side from the selected cell are Vpp–Vaa, the gate-source voltage of the selected cell is 0V, the gate-drain voltage is Vaa, and the source-drain voltage is Vaa. Moreover, the gate-drain voltage and gate-source voltage of all the cell transistors on the plate line side from the selected cell are Vpp–Vaa, the source-drain voltage is 0V, and all the voltages applied to the transistors are small. Furthermore, the gate-drain voltage and gate-source voltage of the transistors on the plate line side from the selected cell are Vaa, and the drain-source voltage is 0V. Subsequently, while the plate line is raised to Vaa from Vss, the word line on the plate line side from the selected cell is raised to Vpp, and a plate potential of Vaa is applied to the selected cell. Subsequently, the word line voltages WL0, WL1 and block selection signal BS0 on the bit line side from the selected cell are lowered, for example, to Vaa from Vpp. When the written data is the "1" data, the bit line voltage is unchanged at Vaa. The voltage is lowered to Vss with the "0" data. Thereby, when the cell data to be written is "1", the cell node CN1 indicates Vaa, the bit line voltage is Vaa, and therefore the voltages applied to the transistors of the word lines WL0, WL1, BS0 drop. That is, the gate-source voltage of the transistors of the word lines WL0, WL1, BS0 is 0V, the gate-drain voltage is 0V, and the source-drain voltage drops to 0V. On the other hand, at this time, when the cell data to be written is "0", and when the word line voltage Vaa is higher than the threshold voltage of the cell transistor or the block selection transistor (i.e., Vaa>Vtcell), Vss of the "0" data is propagated to a cell node N1 from the bit line. Therefore, the cell node N1 indicates Vss, the bit line voltage is Vss, and the voltages applied to the transistors of the word lines WL0, WL1 and block selection signal BS0 therefore drop. That is, the gate-source voltages of the transistors of the word lines WL0, WL1 and block selection signal BS0 are Vaa, the gate-drain voltage is vaa, and the source-drain voltage drops to 0V. Thereafter, the block selection signal BS0 is lowered to Vss, the word line is raised to Vaa, the bit line is precharged at Vaa, and one-cycle operation ends.

As described above, according to the present system, the voltage applied to the cell transistor or the block selection transistor is Vaa at maximum, and the voltage of Vpp is not applied as in the conventional system. Additionally, also in the present system, the cell transistor having the ferroelectric capacitor ON is short-circuited, the cell data is not collapsed, and the refresh operation is unnecessary.

Fifteenth Embodiment

Figure 17:
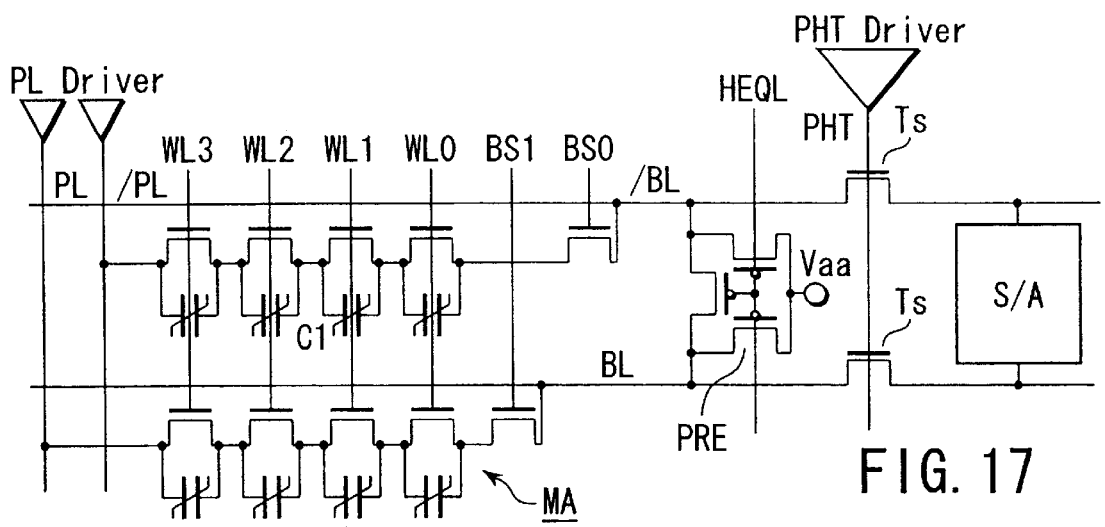
FIG. 17 shows the ferroelectric memory circuit in a fifteenth embodiment of the present invention, and shows a circuit constitution for realizing the operation described with reference to FIGS. 16A, 16B.

FIG. 17 shows the circuit constitution for realizing the operation described with reference to FIGS. 16A, 16B.

FIG. 17 shows a pair of bit lines BL and /BL and the associated constitution. However, in actuality, a large number of circuits constituted as shown in FIG. 17 are arranged in the word line direction to form the memory cell array.

In the circuit of FIG. 17, a separation transistor Ts between a cell array and sense amplifier and a precharge circuit PRE to Vaa on the cell array MA side are connected to a sense amplifier circuit S/A disclosed in the U.S. Pat. No. 5,903,492 of the present inventor.

In the DRAM or the ferroelectric memory of each aforementioned embodiment, the voltage applied to the cell transistor can be moderated, the cell transistor can be reduced, and reliability can be enhanced. On the other hand, even when the size of the gate oxide film or the like of the cell transistor in the DRAM or the ferroelectric memory according to the respective embodiments can be reduced, a transistor having an oxide film thickness different from the thickness of the gate oxide film of the cell transistor needs to be used in order to secure reliability in the core circuit or the boosted voltage circuit for driving the word line, or a circuit portion with the high voltage applied thereto in an I/O circuit according to the conventional art.

FIGS. 18 to 23 show a circuit constitution in which a high voltage is not applied even with use of the transistor having a reduced size in the core circuit for driving the word line, boosted voltage generation circuit, I/O circuit, or the like.

Figure 18A:
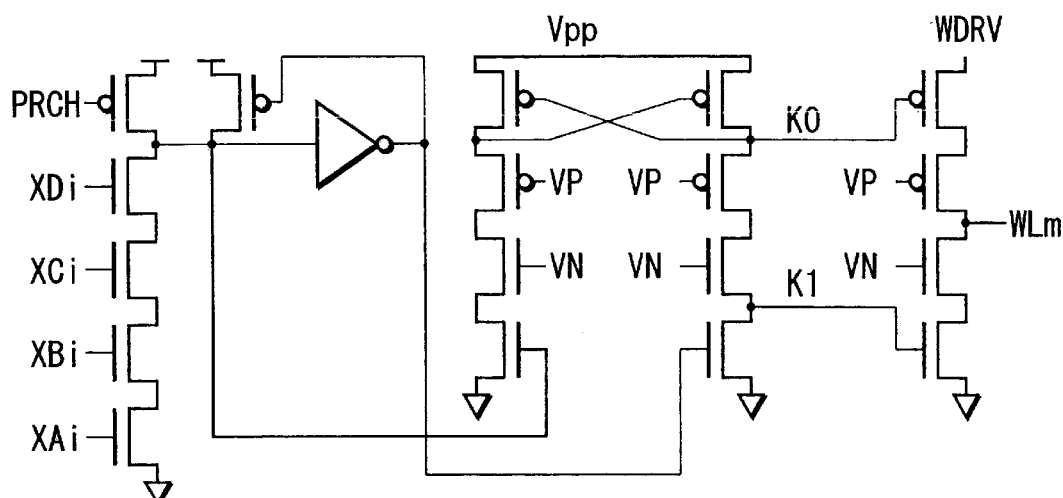
FIG. 18A shows a circuit constitution of a row decoder applicable to the DRAM or the ferroelectric memory of each of the aforementioned embodiments.
Figure 18B:
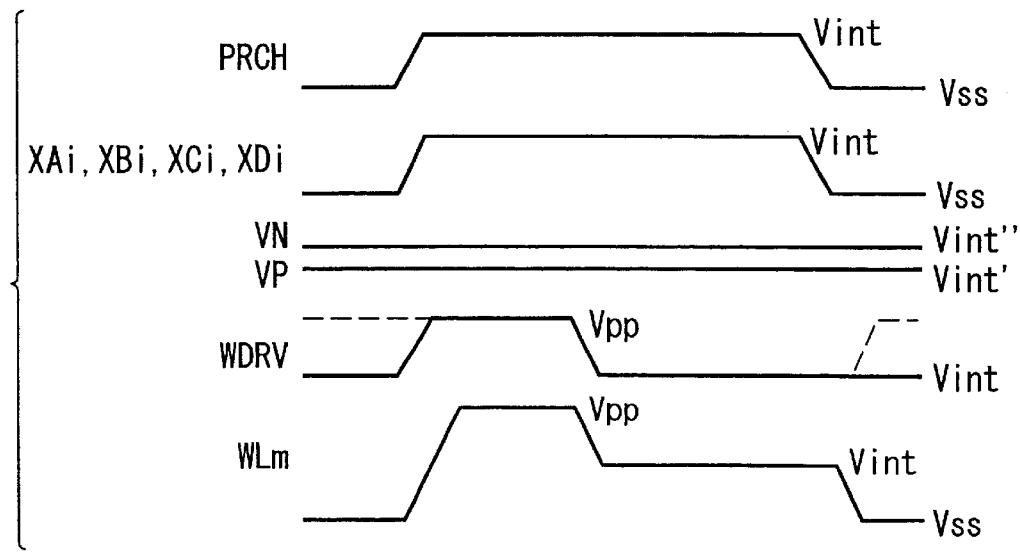
FIG. 18B shows the signal chart.

FIG. 18A shows a circuit constitution of a row decoder applicable to the DRAM or the ferroelectric memory according to the respective embodiments, and FIG. 18B shows the signal chart. The potential of a word line WLm changes to Vpp from Vss and further to Vss from Vaa (=Vint) according to the present invention.

When WDRV indicates a power signal, WLm is in an H level state, and WDRV is set to Vpp, Vpp is outputted to WLm. When WDRV is set to Vaa (=Vint), Vaa (=Vint) is outputted to WLm. A portion to which Vpp is applied is a circuit constitution in which two stages of NMOS transistors and two stages of PMOS transistors are connected in series. For example, with WLm=Vpp, for the NMOS driver transistor on a Vpp side as the final stage, gate=VN. Therefore, when drain=Vpp, source=VN−Vt and the source potential is a potential dropping by the threshold value. Moreover, the gate-drain voltage=Vpp−VN, gate-source voltage=Vt, drain-source voltage=Vpp−VN+Vt, and the voltage is moderated. For the NMOS driver transistor on a Vss side as the final stage, drain=VN−Vt, the gate voltage is VN−Vt because of a drop of the previous stage by the threshold value, the gate-drain voltage=0V, gate-source voltage=VN−Vt, drain-source voltage=VN−Vt, and the voltage is moderated. The potential of an output signal K0 of a connection node of the PMOS driver transistor of a second stage as the final stage is Vpp−VP during selection of the word line. With substantial Vpp−VP=Vaa, during lowering of WDRV to Vaa, a transistor in which the signal K9 is inputted into the gate and WDRV is inputted into the source is possibly turned OFF. However, a direction in which the signal K0 drops is a direction in which the transistor with Vp inputted thereto is turned ON. Therefore, when WDRV is lowered to Vaa from Vpp, the transistor is ON, the potential of the signal K0 drops due to coupling, and the transistor is prevented from being off. Moreover, WDRV may vary among Vss–Vaa–Vpp. Then, the state K0=Vpp exists with Vpp=0V, and therefore a voltage of Vpp is applied to the transistor.

Figure 19A:
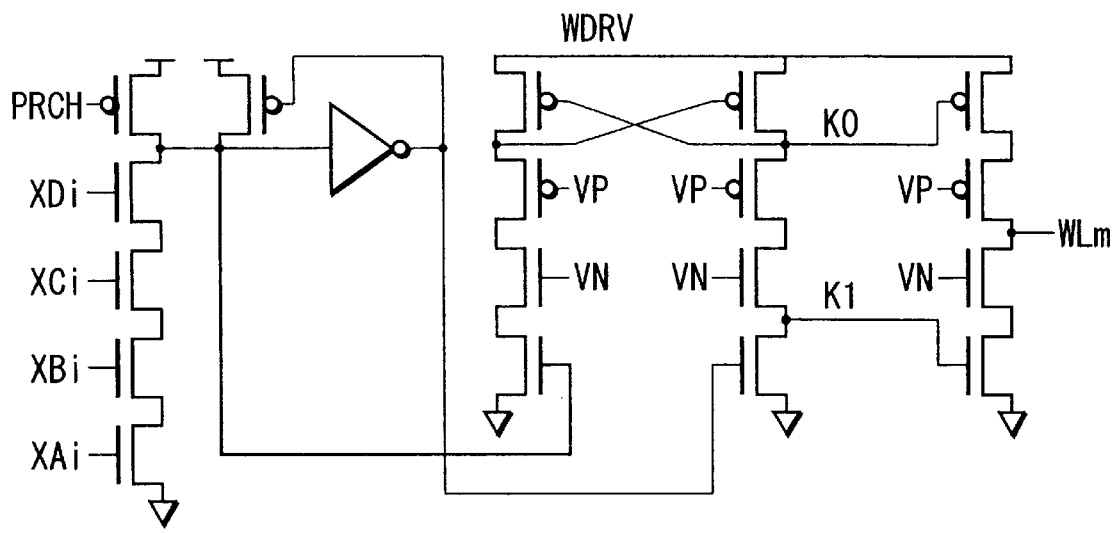
FIG. 19A is a diagram similar to FIG. 18A, showing another circuit constitution of the row decoder applicable to the DRAM or the ferroelectric memory according to the respective embodiments.
Figure 19B:
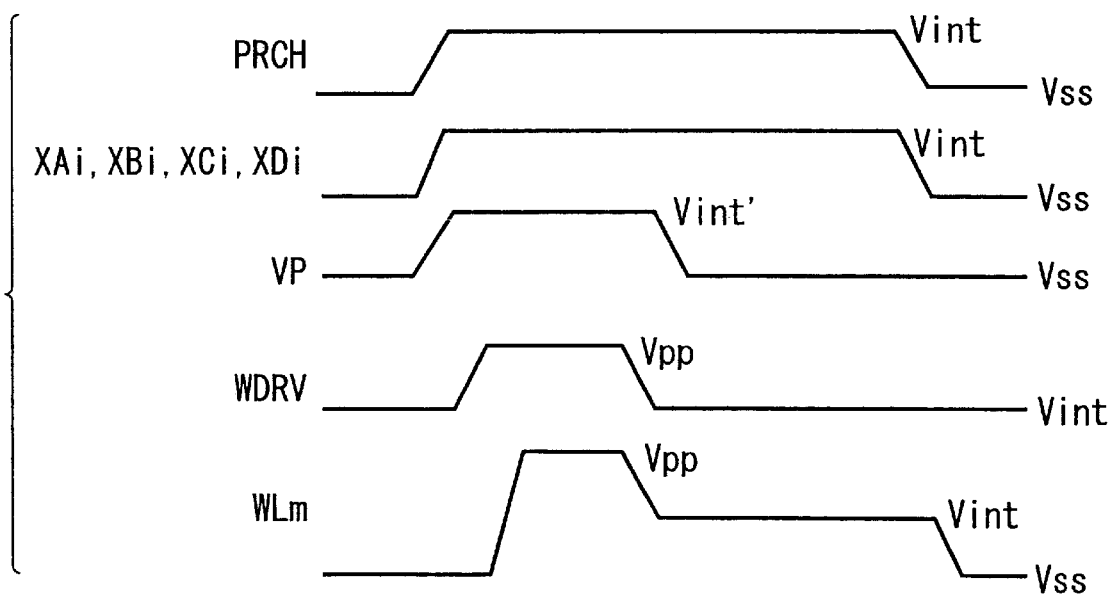
FIG. 19B shows the signal chart.

FIG. 19A shows another circuit constitution of the row decoder applicable to the DRAM or the ferroelectric memory according to the respective embodiments, and FIG. 19B shows the signal chart. Different from FIGS. 18A, 18B, in the circuit constitution, all boosted voltage portions are WDRV power sources, WDRV varies between Vpp–Vaa, and thereby the word line WLm can change to Vpp from Vss and further to Vss from Vaa. When WDRV reaches Vpp, the VP potential is also raised, and the applied voltage of PMOS is moderated. Additionally, the row decoder circuits described with reference to FIGS. 18A, 18B and FIGS. 19A, 19B can also be applied to the PHT signal generation circuit and block selection signal generation circuit.

Figure 20A:
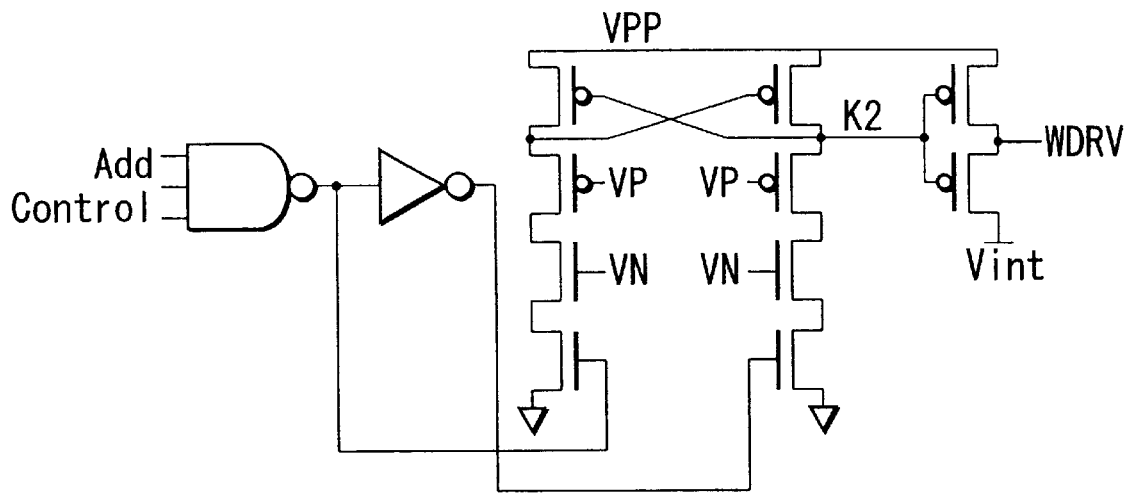
FIG. 20A shows a constitution of a signal generation circuit for the row decoder for generating a WDRV signal applied to the row decoder circuit diagram described with reference to FIGS. 18A, 18B or 19A, 19B.
Figure 20B:
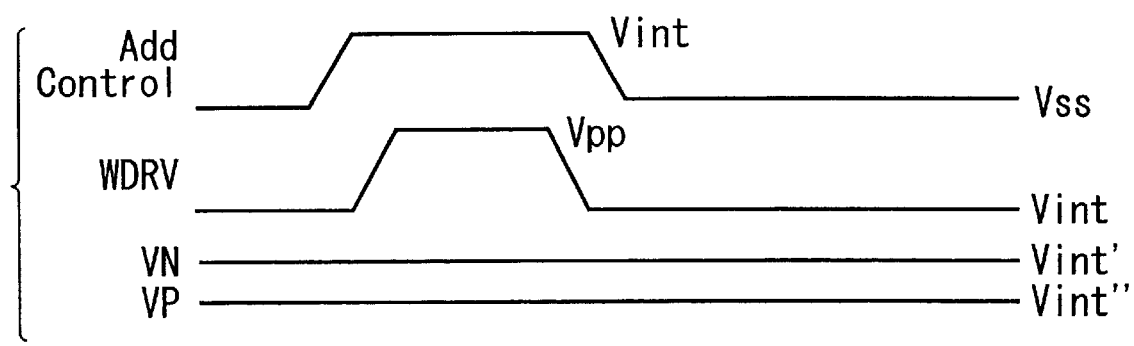
FIG. 20B shows the signal chart.

FIG. 20A shows a constitution of the signal generation circuit for the row decoder, and FIG. 20B shows the signal chart. In FIG. 20A, a WDRV signal to be applied to the row decoder circuits described with reference to FIGS. 18A, 18B, and FIGS. 19A, 19B is generated.

While variation of the WDRV potential between Vpp and Vaa (=Vint) is realized, the voltages applied to the respective transistors are moderated. Additionally, Vaa is an operation voltage inside the chip, and Vaa is generally generated by lowering a power source voltage Vdd outside the chip by a step-down circuit disposed inside the chip.

Figure 21A:
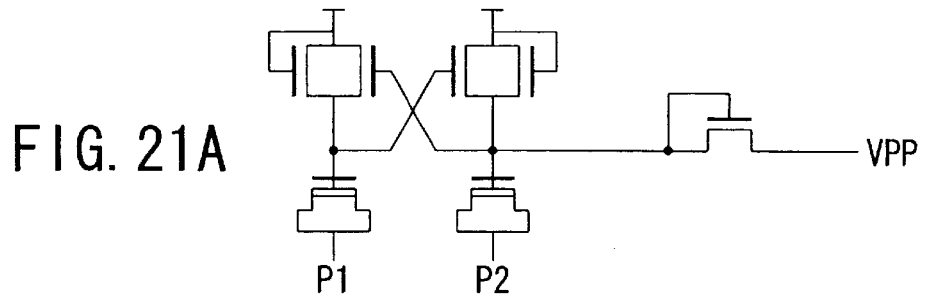
FIG. 21A shows a boosted voltage potential Vpp generation circuit applicable to the DRAM or the ferroelectric memory according to the respective embodiments.
Figure 21B:
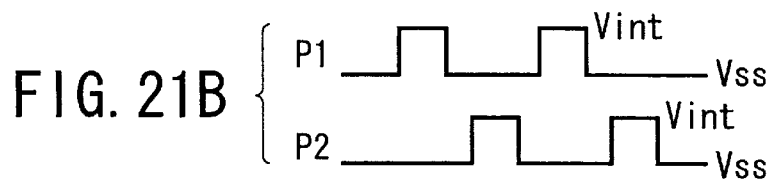
FIG. 21B shows the signal chart.

FIG. 21A shows a boosted voltage potential Vpp generation circuit applicable to the DRAM or the ferroelectric memory according to the respective embodiments, an FIG. 21B shows the signal chart. While the boosted voltage potential Vpp is generated, the voltages applied to the respective transistors can be moderated.

Figure 22A:
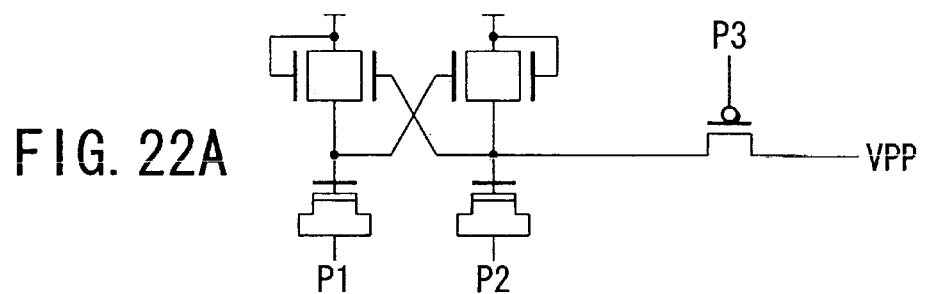
FIG. 22A shows the boosted voltage potential Vpp generation circuit applicable to the DRAM or the ferroelectric memory according to the respective embodiments.
Figure 22B:
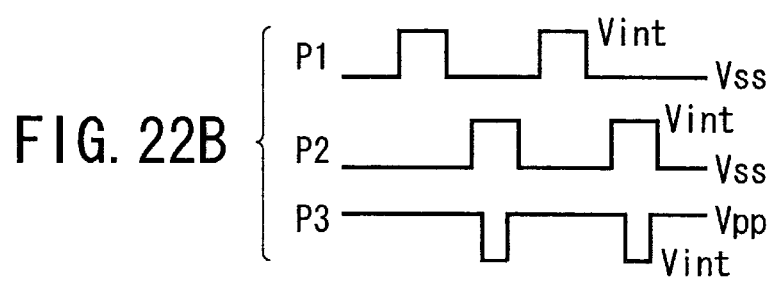
FIG. 22B shows the signal chart.

FIG. 22A shows another boosted voltage potential Vpp generation circuit applicable to the DRAM or the ferroelectric memory according to the respective embodiments, an FIG. 22B shows the signal chart. While the boosted voltage potential Vpp is generated, the voltages applied to the respective transistors can be moderated.

Figure 23:
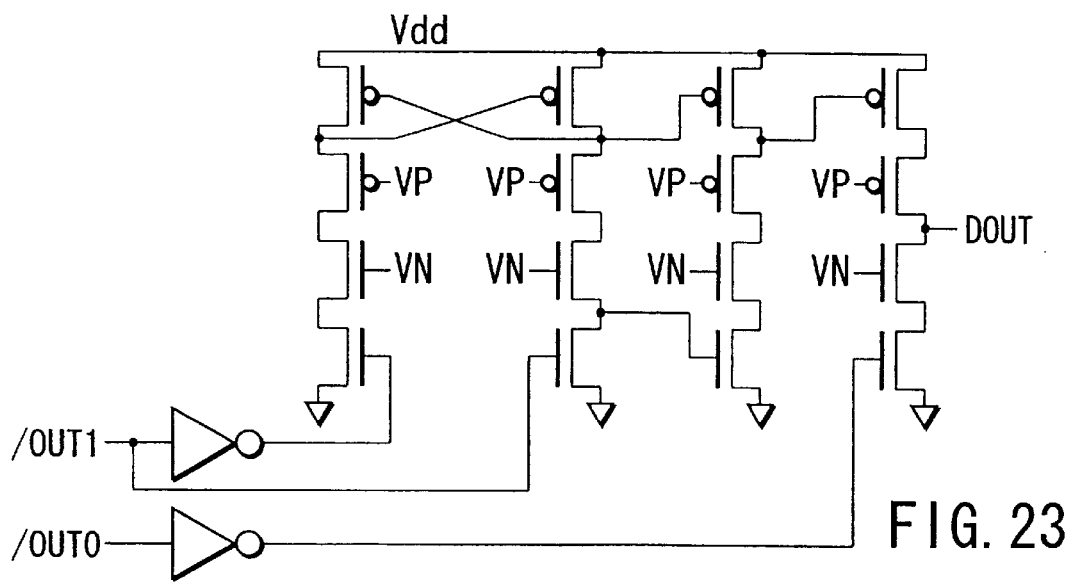
FIG. 23 shows an output buffer circuit applicable to the DRAM or the ferroelectric memory according to the respective embodiments.

FIG. 23 shows an output buffer circuit applicable to the DRAM or the ferroelectric memory according to the respective embodiments. While an output signal of a Vss–Vdd amplitude is generated, the voltages applied to the respective transistors can be moderated.

Figure 24A:
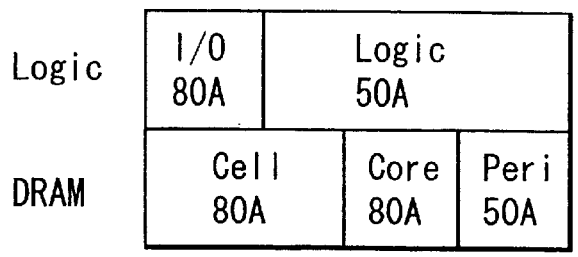
FIG. 24A shows an example of a gate oxide film thickness of a transistor in a conventional DRAM-Logic mixed chip.
Figure 24B:
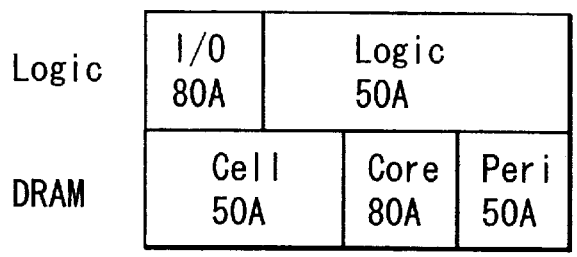
FIG. 24B shows an example of the gate oxide film thickness of the transistor in the DRAM-Logic mixed chip to which the respective embodiments shown in FIGS. 1A to 17 are applied.
Figure 24C:
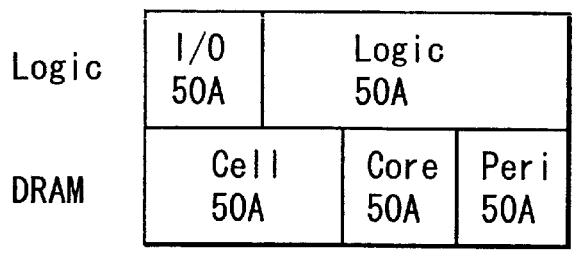
FIG. 24C shows an example of the gate oxide film thickness of the transistor in the DRAM-Logic mixed chip to which the respective embodiments shown in FIGS. 1A to 23 are applied.

FIG. 24A shows an example of the gate oxide film thickness of the transistor in a conventional DRAM-Logic mixed chip. FIGS. 24B, 24C show examples of the gate oxide film thickness of the transistor in a case in which the constitutions shown in FIGS. 1A to 23 are used in the DRAM-Logic mixed chip. Additionally, the oxide film thickness example is also applicable to the ferroelectric memory-Logic mixed chip.

FIG. 24A shows the gate oxide film thickness example of the transistor in the conventional DRAM-Logic mixed chip. Since the high voltage is applied to the memory cell, core circuit, or I/O circuit, the oxide film is as thick as 80A. Moreover, in the conventional example, there is a case in which the oxide films of all the transistors are thick. In this case, the process cost is low, but the performance of the logic section is largely deteriorated.

FIG. 24B shows the gate oxide film thickness example of the transistor in the DRAM-Logic mixed chip to which the respective embodiments shown in FIGS. 1A to 17 are applied. In this case, the oxide film of the transistor only of the core circuit or the I/O circuit is as thick as 80A. However, the gate oxide film of the transistor of the logic circuit, memory cell, or peripheral circuit is as thin as 50A. The cell transistor can be reduced, and the cell and chip sizes are small.

FIG. 24C shows the gate oxide film thickness example of the transistor in the DRAM-Logic mixed chip to which the respective embodiments shown in FIGS. 1A to 23 are applied. In this case, the oxide film of the transistor in all the circuits is as thin as 50A, high performance is achieved, and the process cost is low.

Figure 25A:
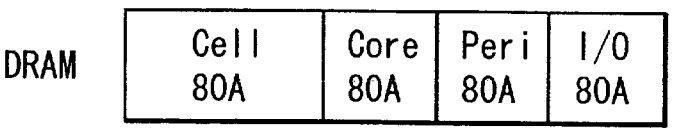
FIG. 25A shows an example of the gate oxide film thickness of the transistor in a conventional DRAM.
Figure 25B:
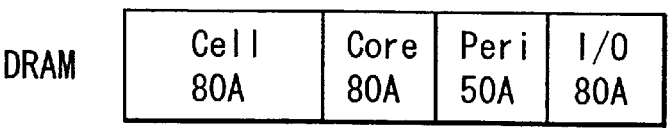
FIG. 25B shows an example of the gate oxide film thickness of the transistor in another conventional DRAM.
Figure 25C:
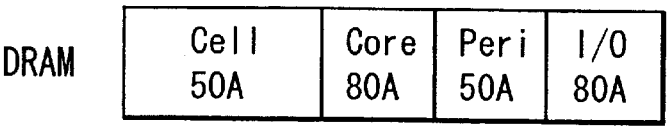
FIG. 25C shows an example of the gate oxide film thickness of the transistor in the DRAM chip to which the respective embodiments shown in FIGS. 1A to 17 are applied.
Figure 25D:
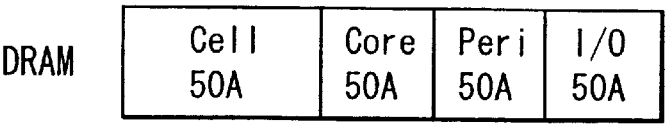
FIG. 25D shows an example of the gate oxide film thickness of the transistor in the DRAM chip to which the respective embodiments shown in FIGS. 1 to 23 are applied.

FIG. 25A shows an example of the gate oxide film thickness of the transistor in the conventional DRAM, and FIGS. 25B, 25C, 25D show examples of the gate oxide film thickness of the transistor in the DRAM chip to which the respective embodiments shown in FIGS. 1A to 23 are applied. The present embodiment is also applicable to the ferroelectric memory chip.

FIG. 25A shows an example of the gate oxide film thickness of a conventional transistor in the conventional DRAM. The oxide films of all the transistors are as thick as 80A. In this case, the process cost is small, but the performance is inferior.

In FIG. 25B, the oxide films of the transistors of the memory cell, core circuit, and I/O circuit are as thick as 80 A, because the high voltage is applied to the memory cell, core circuit, and I/O circuit. The oxide film of the transistor only of the peripheral circuit is as thin as 50A. In this case, although the peripheral circuit performance is enhanced, the process cost is high.

FIG. 25C shows the gate oxide film thickness example of the transistor in the DRAM chip to which the respective embodiments shown in FIGS. 1A to 17 are applied. The gate oxide film of the transistor only of the core circuit or the I/O circuit is as thick as 80A. The oxide film of the transistor of the memory cell or the peripheral circuit is as thin as 50A. In this case, the cell transistor can be reduced, and the chip size is small.

FIG. 25D shows the gate oxide film thickness example of the transistor in the DRAM chip to which the respective embodiments shown in FIGS. 1 to 22 are applied. The oxide film of the transistor in all the circuits is as thin as 50A. While the high performance is achieved, the process cost is low, and the cell and chip sizes are small.

Figure 27A:
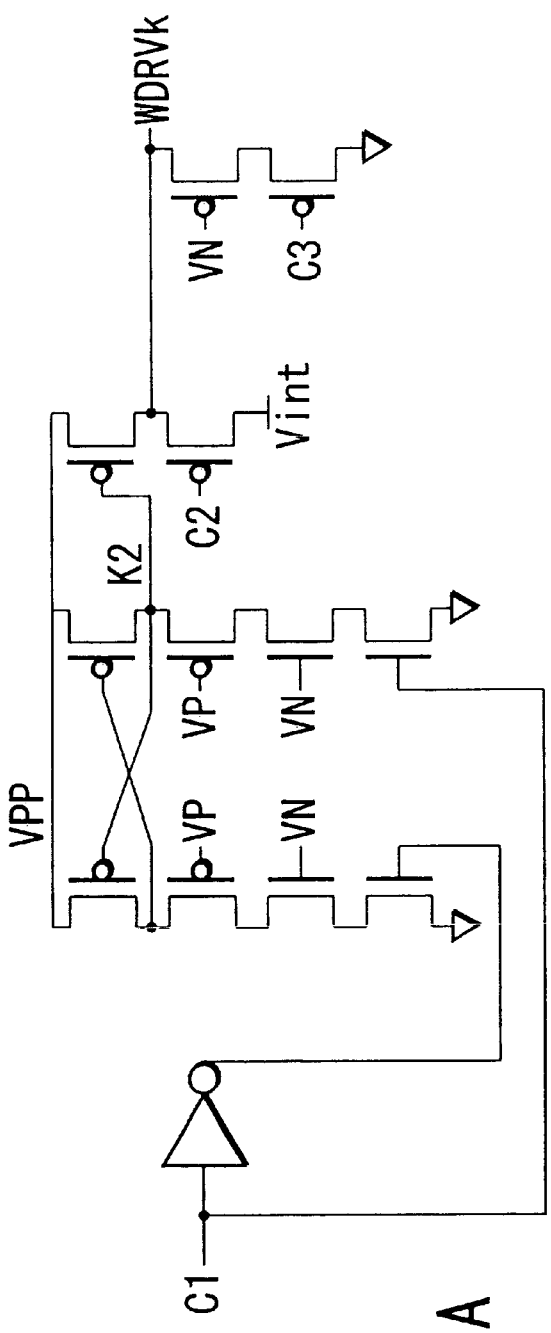
FIG. 27A shows an example of the signal generation circuit for generating a signal WDRVk to the row decoder circuit of FIG. 26A.
Figure 27B:
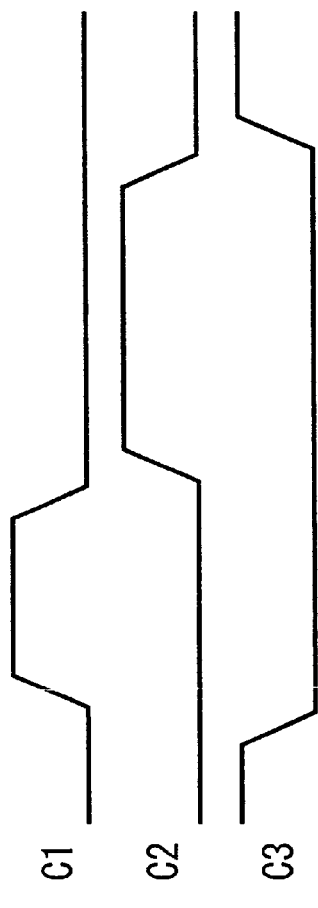
FIG. 27B shows the signal chart.
Figure 28A:
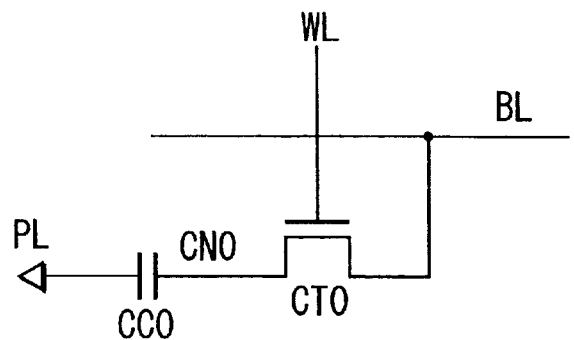
FIG. 28A shows a circuit constitution of the conventional DRAM.
Figure 28B:
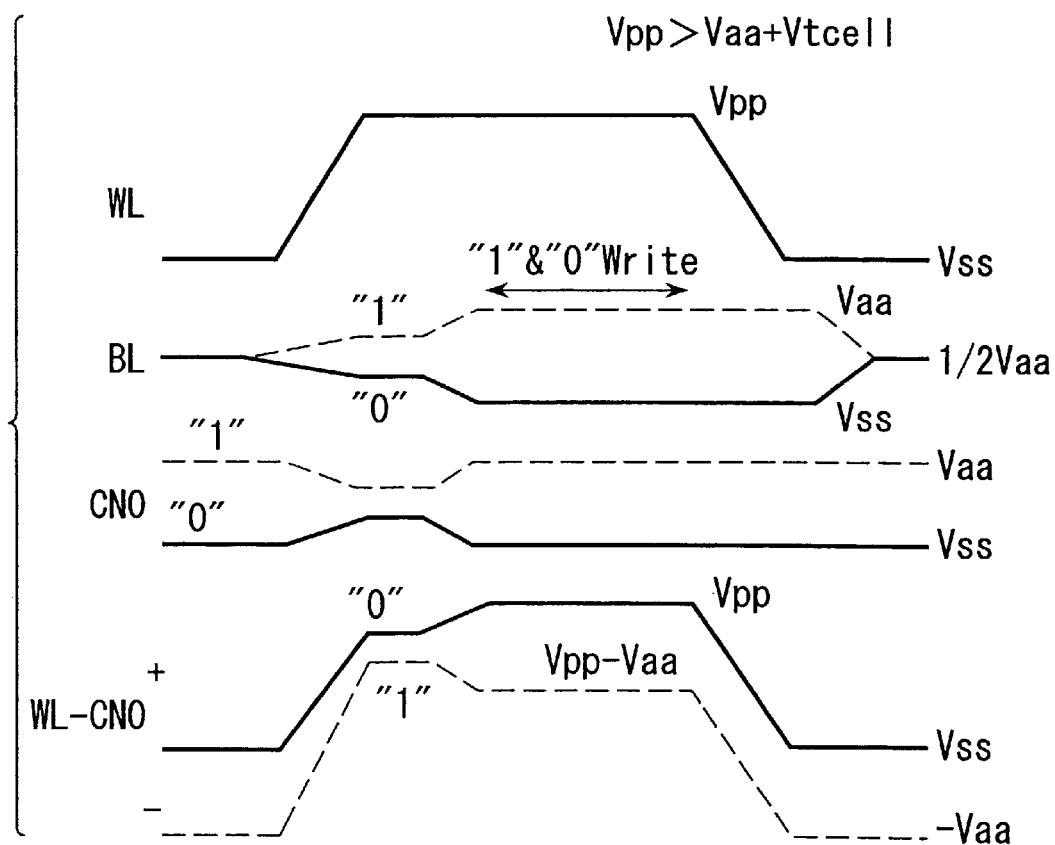
FIG. 28B shows the signal chart.

FIG. 26A shows a row decoder circuit constitution applicable to the DRAM or the ferroelectric memory according to the respective embodiments, and FIG. 26B shows the signal chart. FIG. 27A shows an example of the circuit for generating a signal WDRVk to the row decoder circuit constitution applicable to the DRAM or the ferroelectric memory according to the respective embodiments. FIG. 27B shows the signal chart. The circuit constitutions of FIGS. 26A, 27A are different from the circuit constitutions of FIGS. 18A, 19A, and 20A in that the PMOS transistor has a one stage constitution. The PMOS transistor has little influence of a hot carrier, and is not easily deteriorated, and the high voltage can be applied only to the PMOS transistor. In this example, WDRVk changes to Vpp from Vss, further to Vss from Vaa, and the word line WLm can change to Vpp, Vaa, Vss from Vss.

The present invention has been described based on the embodiments, but can be variously modified and implemented within the scope of the present invention.

According to the present invention, an excessively large voltage can be prevented from being applied to the cell transistor.

Therefore, the threshold voltage of the cell transistor can be raised. While the data holding time is maintained, the voltage applied to the cell transistor is reduced, the cell transistor can be reduced, and the cell and chip sizes can be reduced. Moreover, the size reduction of the transistor can be achieved. When the memory cell is realized by a transistor having a performance as high as that of an LSI, a voltage reduction and speed increase can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor memory circuit which includes a memory cell array including a plurality of memory cells arranged in a matrix form each constituted of a cell transistor and a ferroelectric capacitor having a first end connected to a source of the cell transistor, a plurality of word lines connected to gates of the cell transistors of the memory cells, a plurality of pairs of bit lines connected to drains of the cell transistors of the memory cells, a plate line connected to a second end of the ferroelectric capacitor, and a plurality of sense amplifier circuits each connected to a corresponding pair of bit lines; and
   a control circuit which controls the semiconductor memory circuit in an operation time to raise the word lines to be selected from a first potential to a second potential to read cell data from the memory cells onto the bit lines, thereafter set the bit lines to a high level to write "1" data into the memory cells regardless of a logic level of data to be written, thereafter set the selected word lines to a third potential lower than the second potential and higher than the first potential, set the bit lines to a low level with "0" data to be written to write "0" data into the memory cells, and thereafter to lower the selected word lines to the first potential.

2. The semiconductor memory device according to claim 1, wherein the plate line is set to the low level in a standby time and is raised from the low level to the high level in an operation time.

* * * * *